(12) United States Patent
Yasufuku et al.

(10) Patent No.: US 6,796,831 B1
(45) Date of Patent: Sep. 28, 2004

(54) CONNECTOR

(75) Inventors: Kaori Yasufuku, Yokohama (JP); Taiji Hosaka, Yokohama (JP); Masaaki Miyazawa, Kawasaki (JP)

(73) Assignee: J.S.T. Mfg. Co., Ltd. (JP)

( * ) Notice: Subject to any disclaimer, the term of this patent is extended or adjusted under 35 U.S.C. 154(b) by 0 days.

(21) Appl. No.: 09/690,433

(22) Filed: Oct. 18, 2000

(30) Foreign Application Priority Data

Oct. 18, 1999 (JP) ............................................ 11-295225

(51) Int. Cl.[7] .............................................. H01R 13/00
(52) U.S. Cl. ........................ 439/485; 439/206; 439/196; 439/160; 439/325
(58) Field of Search ................................ 439/485–487, 439/206, 196, 74, 160, 325

(56) References Cited

U.S. PATENT DOCUMENTS

| 3,848,952 A | | 11/1974 | Tighe, Jr. .................. 339/91 R |
| 4,466,049 A | | 8/1984 | Chaney et al. .............. 361/383 |
| 5,310,351 A | * | 5/1994 | McAdow et al. ............. 439/74 |
| 5,339,221 A | | 8/1994 | Conroy-Wass et al. ..... 361/796 |
| 5,901,038 A | * | 5/1999 | Cheng et al. ............... 361/704 |
| 6,050,850 A | * | 4/2000 | Crane, Jr. et al. ........... 439/569 |
| 6,370,025 B1 | * | 4/2002 | Yasufuku et al. ........... 361/704 |

FOREIGN PATENT DOCUMENTS

| EP | 0 529 345 A1 | 3/1993 |
| EP | 0 702 510 A2 | 3/1996 |
| JP | Sho-58-164286 | 11/1983 |
| JP | Hei-5-59777 | 8/1993 |
| JP | 5-211076 | 8/1993 |
| JP | 7-122057 | 5/1995 |
| JP | 8-102346 | 4/1996 |
| JP | Hei-8-116146 | 5/1996 |
| JP | 8-250211 | 9/1996 |

* cited by examiner

*Primary Examiner*—Truc T. T. Nguyen
(74) *Attorney, Agent, or Firm*—Connolly Bove Lodge & Hutz LLP

(57) ABSTRACT

A connector of the present invention is provided with a ventilation means that permits air to pass through along an electronic module with respect to a housing means holding said electronic module. The housing means includes a main body mounting thereon contacts to be connected with conductive pads provided at a front end of the electronic module and a pair of arms, projected from opposite ends of the main body, to hold the electronic module at opposite ends thereof. The ventilation means is provided at the main body and/or the pair of arms. The ventilation means thus formed can permit the electronic module to be cooled efficiently.

21 Claims, 23 Drawing Sheets

F I G. 1 3
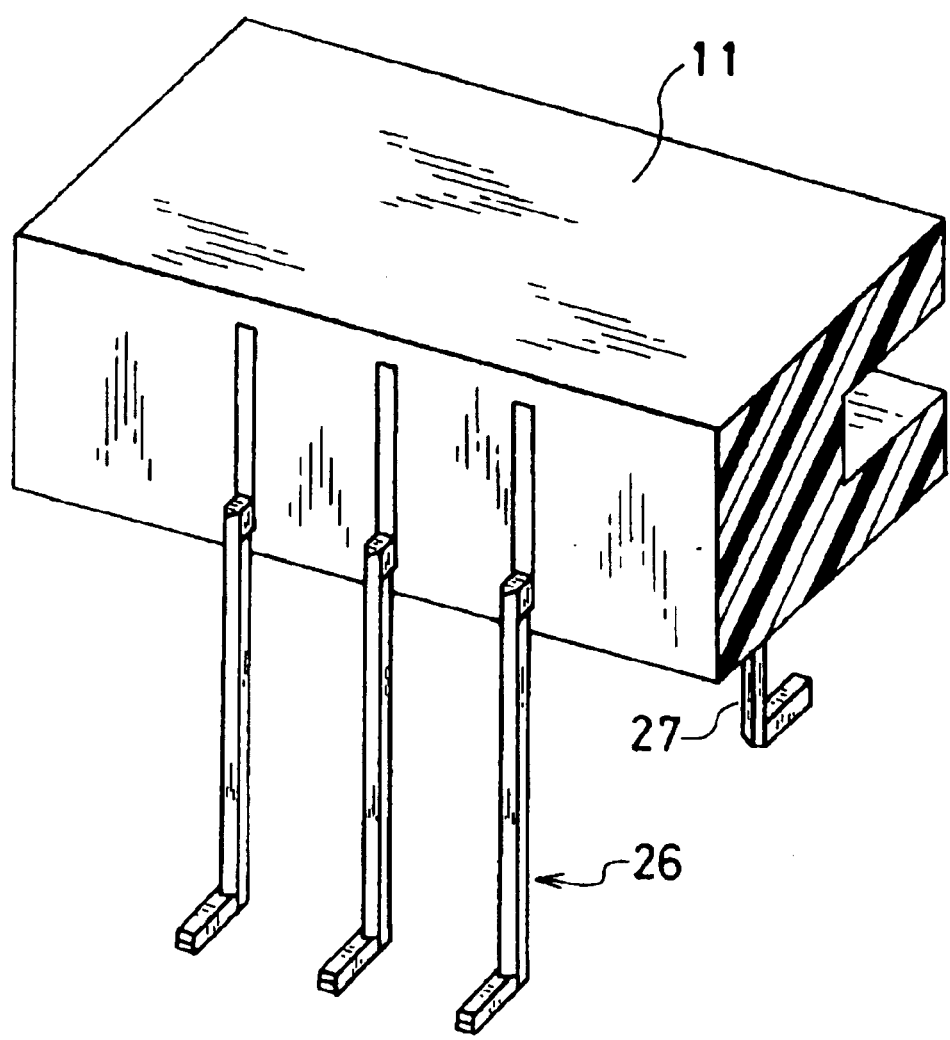

F I G. 1 4 (a)
F I G. 1 4 (b)
F I G. 1 4 (c)

CONNECTOR

BACKGROUND OF THE INVENTION

1. Technical Field of the Invention

The present invention relates to a connector used for fitting thereto a plate-like electronic module such as a memory module and mounting it on a mother board and, more particularly, to a connector having a structure suitable for cooling the electronic module fitted to the connector.

2. Description of the Prior Art

A plate-like electronic module comprises a card-like substrate, electronic chips, such as memory chips, mounted on both top and bottom surfaces of the substrate, and conductive pads formed at an end portion of the substrate and connected with the electronic chips. The plate-like electronic module is fitted to a connector for mounting on a mother board in position.

The connector comprises a housing having a main body mounting thereon contacts to be connected with the conductive pads on the electronic module and a pair of arms extending from both sides of the main body and holding both lateral ends of the electronic module.

When the electronic module is fitted to the connector, the front end of the electronic module is held by the main body and the both lateral ends of the same is held by the pair of arms. When the connector is mounted on the mother board, the electronic chips mounted on the top surface of the electronic module opens upward but the electronic chips mounted on the bottom surface of the electronic module confront the mother board with a little space therebeween.

In recent years, with development of high performance notebook-sized personal computers, tendency has been for an electronic module having high performance electronic chips on board to be placed on the mother board in the notebook-sized personal computer. The high performance electronic chips are prone to generate heat, so the notebook-sized personal computer employs the structure in which an airflow is produced in its case to cool the electronic chips and the like housed therein. The electronic module fitted to the connector is surrounded by the housing having the main body and the arms on three sides of the front end and both lateral ends. Thus, the current of air is hindered from flowing through between the bottom surface of the electronic module and the mother board, in particular, thus providing the problem of insufficient cooling of the bottom of the electronic module.

SUMMARY OF THE INVENTION

Accordingly, it is a primary object of the invention to provide a novel connector having the structure that can permit an efficient cooling of an electronic module fitted to the connector by an airflow passing through it.

It is a secondary object of the invention to provide a novel connector having the structure that can permit an efficient cooling of an electronic module fitted to the connector by ventilation means set in place of the housing.

It is a tertiary object of the invention to provide a novel connector having the structure that can produce an airflow flowing over a plate-like electronic module fitted to the connector, particularly flowing along a short side direction of the plate-like electronic module.

It is a fourth object of the invention to provide a novel connector having the structure that can produce an airflow flowing over the plate-like electronic module fitted to the connector, particularly flowing along a long side direction of the plate-like electronic module.

It is a fifth object of the invention to provide a cooling method that can permit an efficient cooling of the electronic module fitted to the connector.

A first aspect of the invention to accomplish the primary object provides a connector fittable with an electronic module, the connector comprising a housing means to hold the electronic module and a ventilation means, arranged with respect to the housing means, to permit air to pass along the electronic module.

This produces the result that when the connector fitted with the electronic module is mounted on the mother board, air is permitted to pass through along the electronic module, passing through the ventilation means arranged with respect to the housing means.

A second aspect of the invention to accomplish the secondary object provides a connector fittable with an electronic module, the connector comprising a housing means having a main body mounting thereon contacts to be connected with conductive pads provided at a front end of the electronic module and a pair of arms, projected from opposite ends of the main body, to hold the electronic module at opposite end portions thereof; and a first ventilation means provided at the main body or at least one of a pair of second ventilation means provided at the pair of arms, respectively.

This produces the result that when the connector fitted with the electronic module is mounted on the mother board, air is permitted to pass through the bottom surface of the electronic module toward the first ventilation means or at least one of the second ventilation means.

It is preferable that a rectifying means which has an opening to take in air and on which an end of the electronic module at the side opposite the fitting side of the same is rested is mounted to the ends of the pair of arms.

It is preferable that a supporting means on which an end of the electronic module at the side opposite the fitting side of the same is rested is mounted to the ends of the pair of arms. Preferably, the second ventilation means has a configuration to extend in opening toward outside.

A third aspect of the invention to accomplish the tertiary object provides a connector fittable with a plate-like electronic module, the connector comprising a housing means having a main body mounting thereon contacts to be connected with conductive pads provided at a front end of the electronic module and a pair of arms, projected from opposite ends of the main body, to hold the electronic module at opposite end portions thereof; a ventilation means provided at the main body; and wall means provided at the pair of arms, respectively.

This produces the result that when the connector fitted with the electronic module is mounted on the mother board, both lateral sides thereof are closed by the wall means provided at the pair of arms, respectively, so that air flows toward the ventilation means provided at the main body. This permits air to pass through in a short side direction of the plate-like electronic module to achieve the cooling of the electronic chips aligned in a row in the longitudinal direction.

It is preferable that when air is commonly flown over the plurality of connectors, the wall members are attached to the front and rear attachment portions of the pair of arms. Also, it is preferable that the arms are interconnected by the front and rear engaging portions of the pair of arms. Preferably, an upper plate is attached for a topside space that appears when two or more adjacent connectors are coupled with each other. Further, it is preferable that a rectifying means which has an opening to take in air and on which an end of the electronic module at the side opposite the fitting side of the same is rested is mounted on the pair of arms at the ends thereof.

In the case where air flows toward the ventilation means provided under the main body, it is preferable that the contacts are streamlined in section and/or closure means are provided for closing space between the front contacts and the rear contacts, in order to facilitate the stream of air between the downward extending contacts. To prevent the collecting of air-borne dust at the contacts, shielding means or dustproof means are preferably provided for the contacts. Preferably, the dustproof means is a partition means to permit separation between adjacent contacts with respect to each of the front contacts and rear contacts.

A fourth aspect of the invention to accomplish the fourth object provides a connector fittable with a plate-like electronic module, the connector comprising a housing means having a main body mounting thereon contacts to be connected with conductive pads provided at a front end of the electronic module and a pair of arms, projected from opposite ends of the main body, to hold the electronic module at opposite end portions thereof; a pair of ventilation means provided at the pair of arms, respectively; and wall means provided at the main body.

This produces the result that when the connector fitted with the electronic module is mounted on the mother board, one lateral side thereof is closed by the wall means provided at the main body, so that air flows toward the ventilation means provided at the pair of arms. This permits air to pass through the plate-like electronic module in a long side direction thereof to achieve the cooling of the electronic chips aligned in a row in the longitudinal direction in a sequential order.

In order to facilitate the stream of air, the ventilation means preferably has a configuration to extend in opening toward outside. It is preferable that there is provided a wall member to interconnect ends of the pair of arms. Also, it is preferable that at least one of air suction means and air blowing means is adapted to be connectable with the ventilation means.

A fifth aspect of the invention to accomplish the fifth object provides a method for cooling an electronic module fitted to a connector, wherein a ventilation means is provided in a housing means to hold the electronic module and at least one of air suction means and air blowing means is set with respect to the ventilation means, so that an airflow passing through the connector can be produced over the electronic module fitted to said connector.

According to this method, the electronic module fitted to the connector is cooled efficiently by combination of the connector having the ventilation means with at least one of the air suction means and the air blowing means.

Other and further objects, features and advantages of the invention will appear more fully from the following description taken in connection with the accompanying drawings.

BRIEF DESCRIPTION OF THE DRAWINGS

FIG. 13 is a perspective view of front and rear contacts extending downward from the main body;

FIG. 14 are sectional views of the contacts of FIG. 12 showing streamlined configurations;

DESCRIPTION OF THE PREFERRED EMBODIMENT

Figure 1:
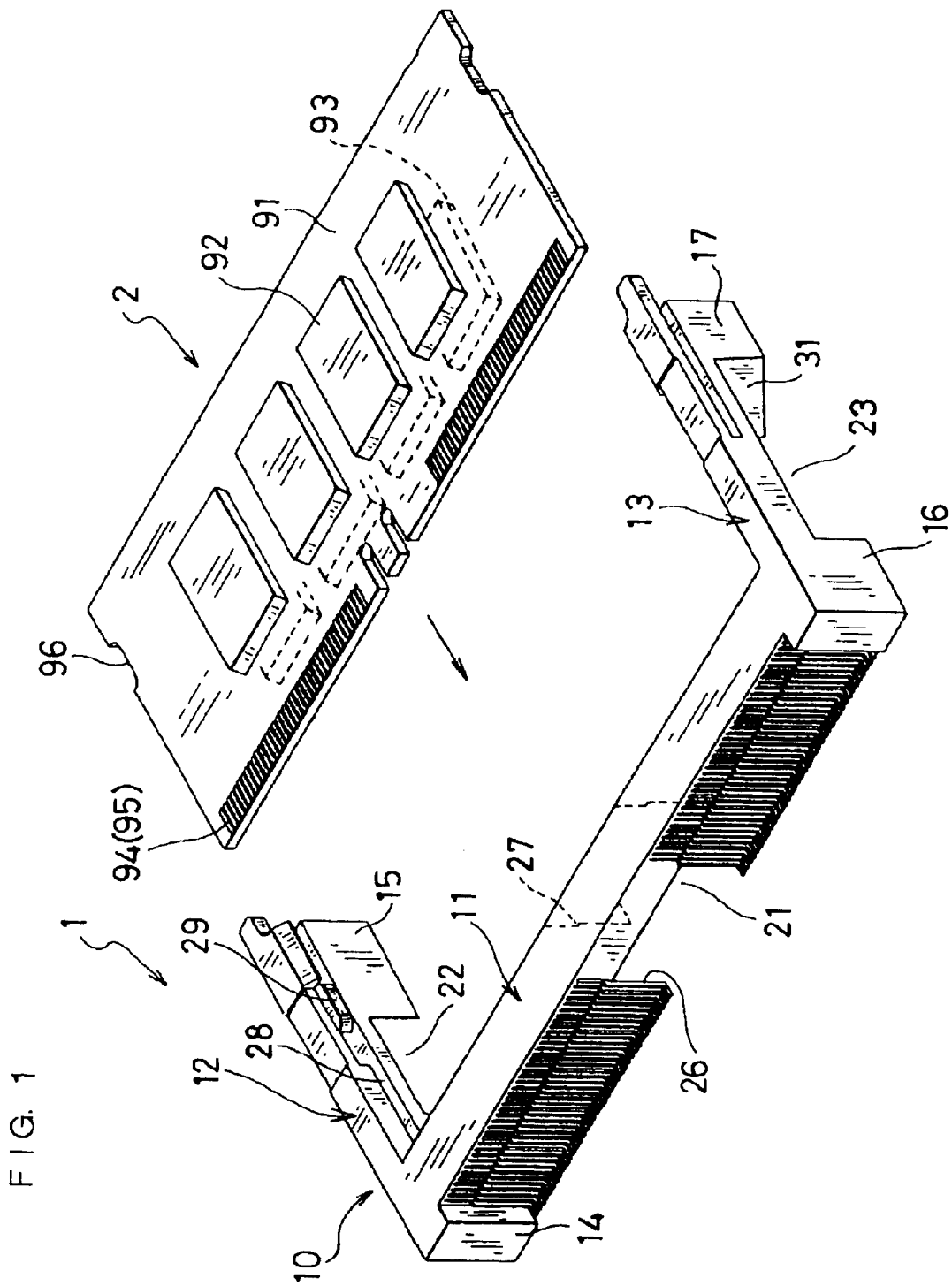
FIG. 1 is a perspective view of a connector according to the first embodiment of the invention.
Figure 2:
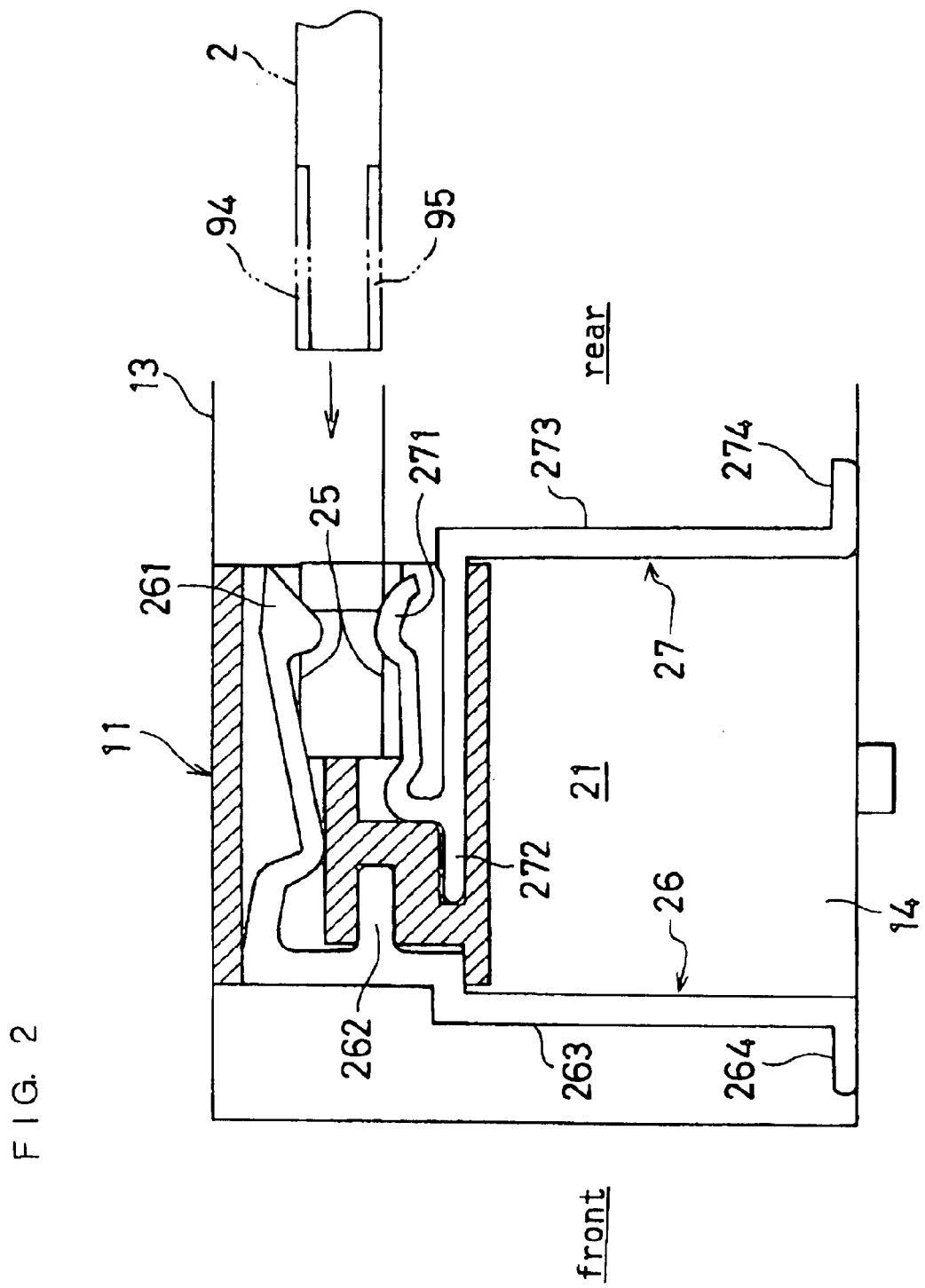
FIG. 2 is a sectional view of a main body mounting contacts thereon.

In the following, the preferred embodiments of the invention will be described with reference to the accompanying drawings. Referring to FIG. 1, there is shown a perspective view of a connector of the first embodiment corresponding to the first aspect of the invention and the second aspect of the invention having the structure suitable for air to flow through a bottom surface of the electronic module. FIG. 2 is a sectional view of a main body mounting contacts thereon.

The connector 1 shown in FIG. 1 comprises a housing (housing means) 10 having a main body 11 and a pair of arms 12, 13 integrally extending from both ends of the main body 11 in a perpendicular direction; base portions 14, 15 and 16, 17 of the pair of arms 12, 13 from front and rear of the pair of arms 12, 13, respectively; and integrally extending downward, a first ventilation hole (ventilation means) 21 provided between base portions 14, 16 and under the main body 11; and a pair of second ventilation holes (ventilation means) 22, 23 which are provided between the base portions 14, 15 and under the arm 12 and between the base portions 16, 17 and under the arm 13, respectively.

The plate-like electronic modules 2 fitted to the connector 1 comprises a case-like substrate 91, electronic chips 92 such as memory chips mounted on a top surface of the substrate 91, electronic chips 93 such as memory chips mounted on a bottom surface of the substrate 91, conductive pads 94, 95 mounted on the top and bottom surfaces of the substrate 91 at front ends thereof, respectively, and recesses 96 at both lateral ends of the substrate 91. In general, two or more electronic chips 92 mounted on the top and bottom surfaces of the substrate 91 are aligned in a row in the longitudinal direction of the substrate.

As shown in FIG. 2, the main body 11 has a cavity 25, formed at about a thicknesswise center portion thereof, for receiving therein the front end of the electronic module 2. The main body 11 has such a structure that front contacts 26 having one end connectable with the upper conductive pad 94 of the electronic module 2 and the other end connectable with a mother board (not shown) can be press-inserted into the main body and also rear contacts 27 having one end connectable with the lower conductive pad 95 of the electronic module 2 and the other end connectable with the mother board (not shown) can be press-inserted into the main body.

The front contacts 26 are stamped out into a cantilever arm shape, having one end 261 biased inwardly of the cavity 25, a fitting portion 262 to be fitted into the main body 11, a vertically extending portion 263 extending downward across the first ventilation hole 21, and the other end 264 extending along a lower end of the base portion 14.

The rear contacts 27 are stamped out into a cantilever arm shape, having one end 271 biased inwardly of the cavity 25, a fitting portion 272 to be fitted into the main body 11, a vertically extending portion 273 extending downward across the first ventilation hole 21, and the other end 274 bent along the lower end of the base portion 14.

In FIG. 1, the right and left arms 12, 13 are symmetric with respect to a center line of the main body 11. The arms 12, 13 have slots 28 for both ends of the electronic module 2 to be guided or supported in. The slots 28 have projections 29 formed on the way thereof to correspond to the recesses 96 formed in the both ends of the electronic module 2.

The first ventilation hole 21 is provided between the base portions 14, 16 and under the main body 11. Although the front contacts 26 and rear contacts 27 extend downward from top to bottom across the ventilation hole 21, air flows through gaps between the adjacent front contacts 26 and gaps between the adjacent rear contacts 27.

The pair of second ventilation holes 22, 23 are provided between the base portions 14, 15 and under the arm 12 and between the base portions 16, 17 and under the arm 13, respectively. Preferably, the ventilation holes 22, 23 each have such a slanted surface 31 as to increase in opening toward the outside, for ease of air suction. The first ventilation hole 21 and the second ventilation holes 22, 23 are not limited to the apertures opening to the bottom but may be formed into quadrangular apertures closing at the bottom.

The main body 11, the arms 12, 13 and the base portions 14, 15, 16, 17 are formed into one piece by use of insulating resin. The main body 11 and the arms 12, 13 may be formed separately so that they can be combined into one by fitting engagement. The base portions 14, 15, 16, 17 may also be combined with the arms 12, 13 by fitting engagement. Further, in place of the base portions 14, 16 provided at the both ends of each of the arms 12, 13, the base portions may alternatively be provided at both long side ends of the main body 11.

The fitting of the connector 1 and the electronic module 2 thus structured will be described with reference to FIG. 1. The both long side ends of the substrate 91 of the electronic module 2 are inserted in the slots 28. While the pair of the arms 12, 13 are pushed outward by the projections 29 in the slots 28, the electronic module 2 is inserted until the recesses 96 in the electronic module 2 are engaged with the projections 29. Then, the front end of the electronic module 2 is received in the cavity 25 and the conductive pads 94, 95 are brought into contact with one ends 261, 271 of the contacts 26, 27, to make electric connection between the electronic module 2 and the contacts 26, 27, as shown in FIG. 2. Thereafter, the electronic module 2 is held by the pair of arms 12, 13 at both ends thereof.

Figure 3:
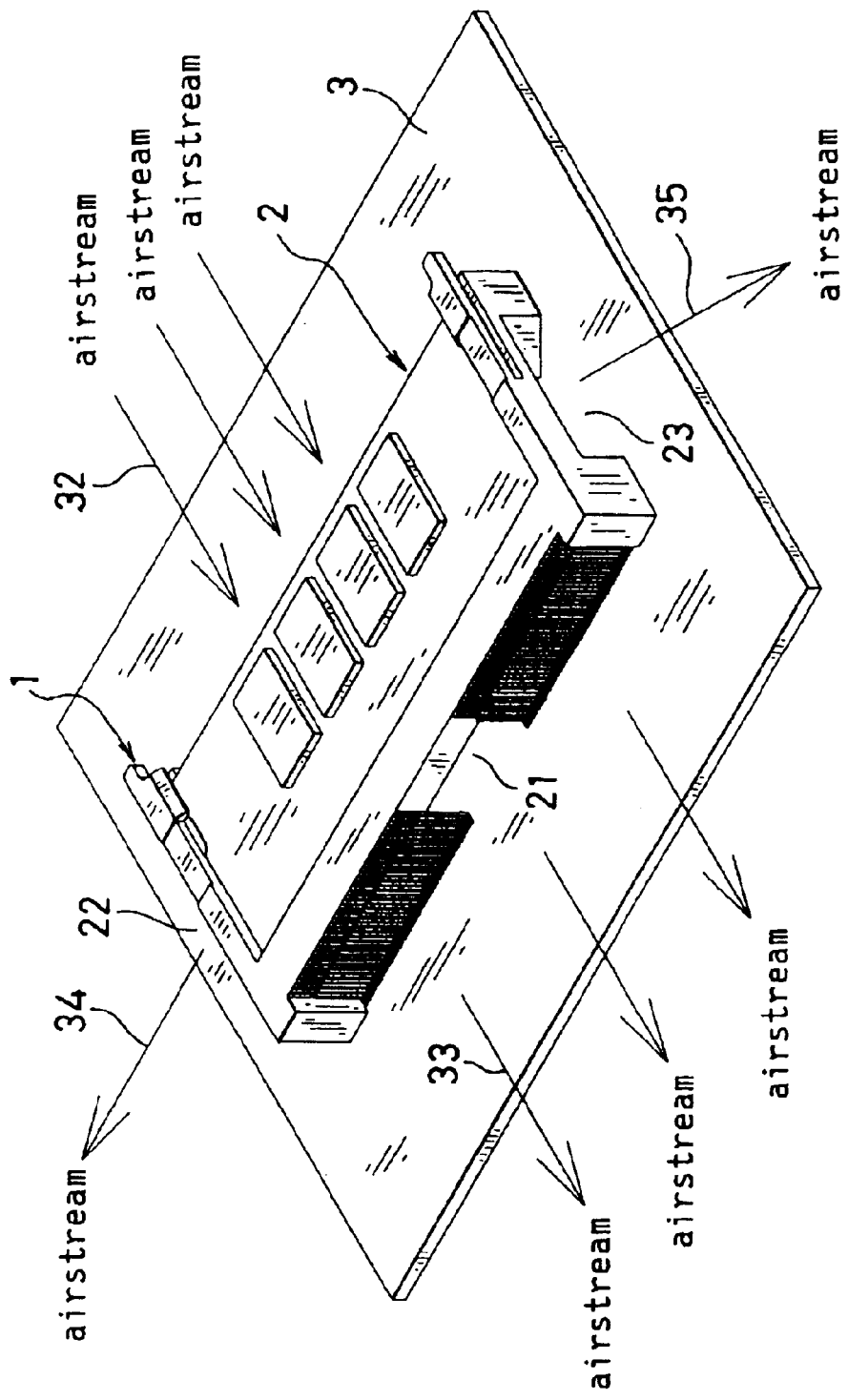
FIG. 3 is a perspective view showing the state in which the connector fitted with an electronic module is mounted on a mother board.

Referring to FIG. 3, there is shown the state in which the connector 1 fitted with an electronic module 2 is mounted on the mother board 3. Cooling airstream 32 is produced along the mother board 3. The airstream 32 entering from the side opposite the fitting side of the electronic module 2 is divided into three branches of an airstream 33 passing through the first ventilation hole 21 and airstreams 22, 23. As a result of this, the airstream is produced on the bottom surface of the electronic module 2, so that the electronic chips mounted on the bottom surface of the electronic module 2 are cooled by the airstream. Also, the airstream 32 is also produced on the top surface of the electronic module 2, so that the electronic chips mounted on the top surface of the electronic module 2 are also cooled simultaneously. For establishing efficient cooling of the top surface of the electronic module 2, a ventilation hole may be provided over the main body 11 or at least one of the pair of arms 12, 13, in addition to or in place of the ventilation hole 21 under the main body 11 and the ventilation holes 22, 23 under the pair of arms 12, 13.

Figure 4:
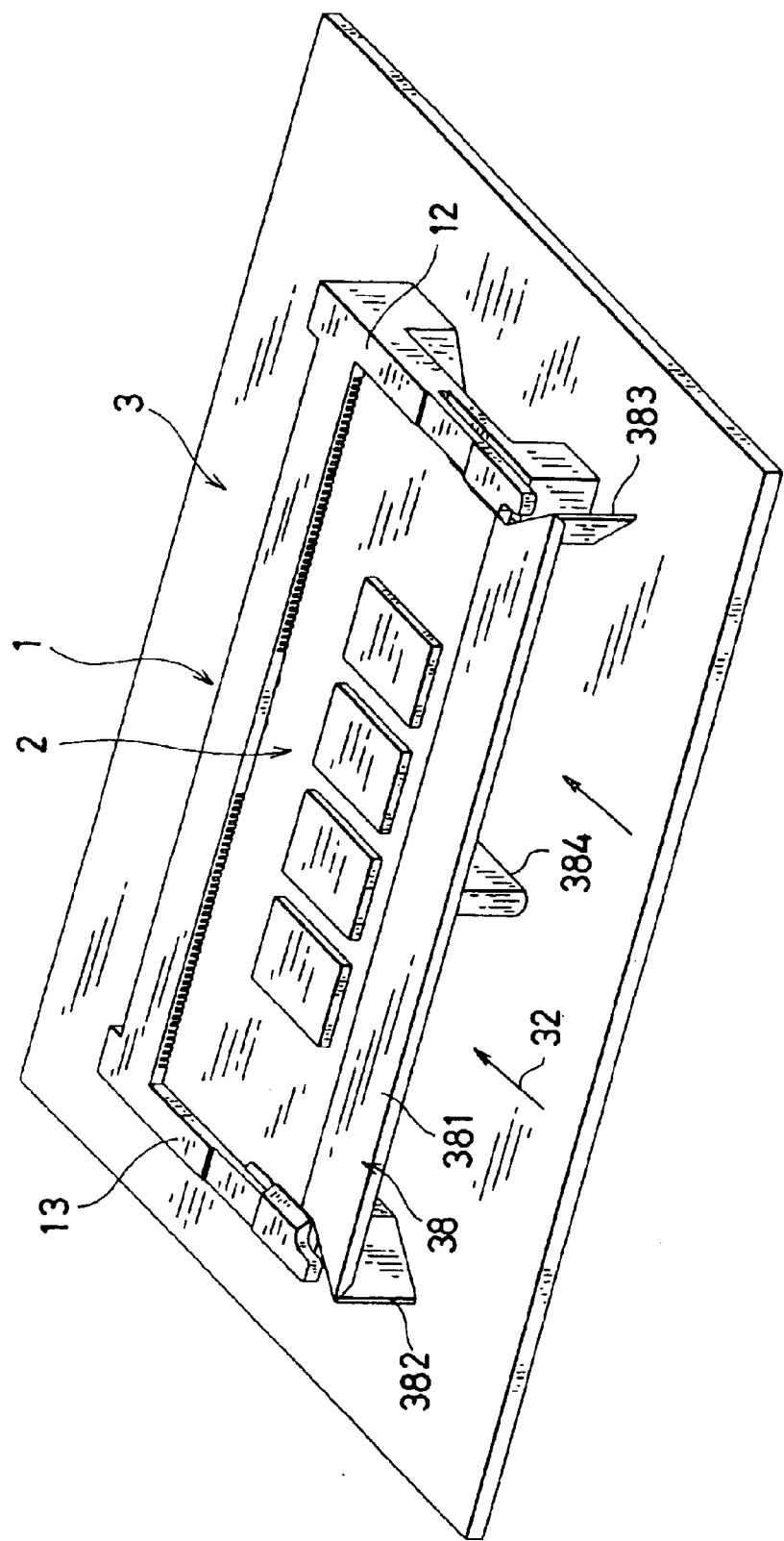
FIG. 4 is a perspective view showing the state in which a rectifying means is mounted on ends of the arms of the connector fitted with the electronic modules.
Figure 5:
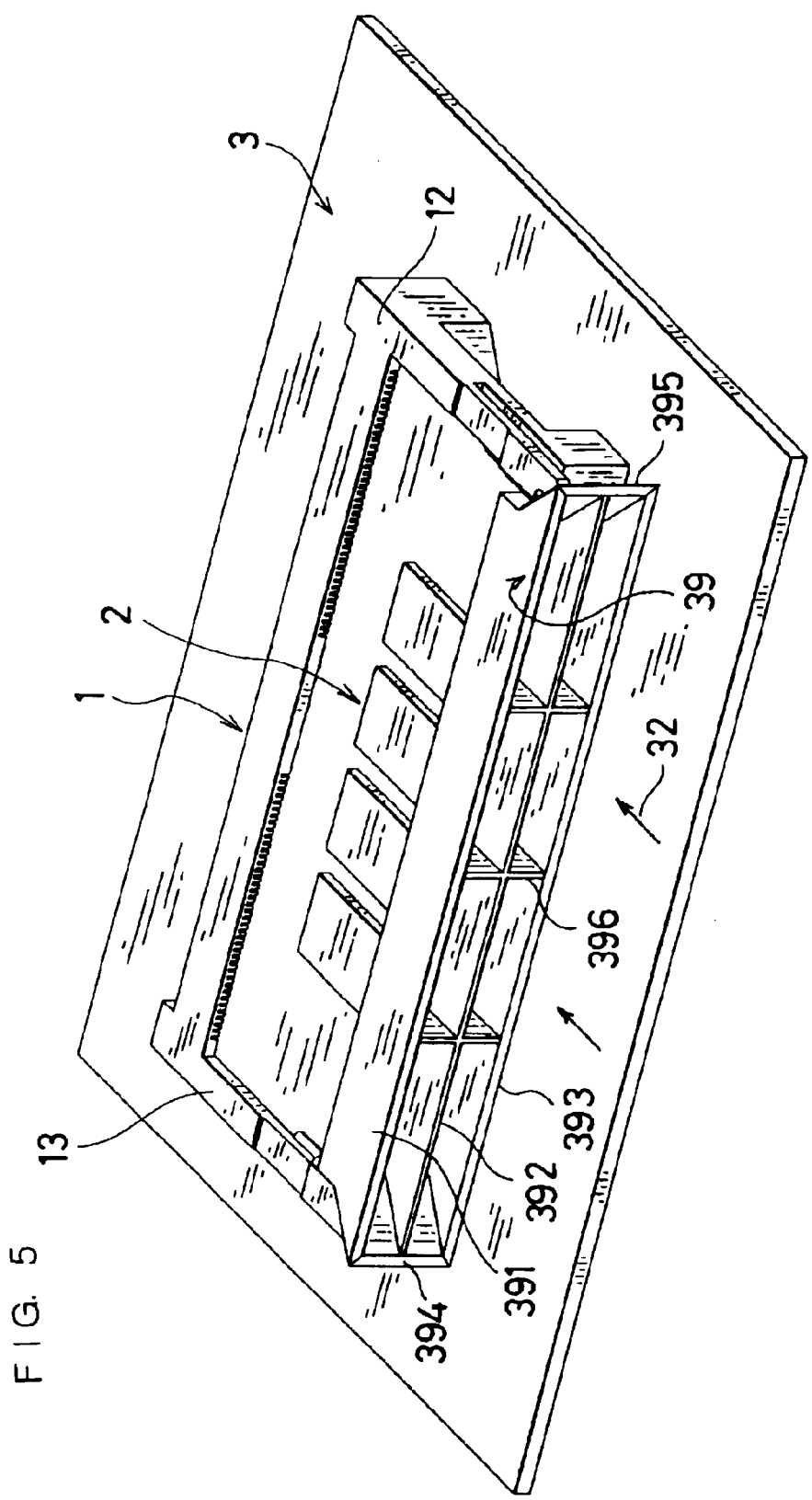
FIG. 5 is a perspective view showing the state in which another rectifying means is mounted on ends of the arms of the connector fitted with the electronic module.

Referring now to FIGS. 4 and 5, there are shown the connectors 1 in which rectifying plates 38, 39, functioning as rectifying means, are attached to the front ends of the arms 12, 13, respectively, so that the airstream 32 can easily be taken in toward the electronic module 2. The rectifying plates 38, 39 also function as supporting means to rest thereon an end of the electronic module 2 on the side opposite the fitting side of the same.

The rectifying plate (rectifying means or supporting means) 38 of FIG. 4 is formed into one piece by use of resin or metal, including a plate material 381, legs 382, 383 provided at both ends of the plate material 381 and a leg 384 provided at a center of the plate material 381. The legs 382, 383 have a configuration to extend in opening toward outside so that the air flowing together with the airstream 32 can easily be taken in toward the bottom surface of the electronic module 2. The plate material 381 is provided, at an end thereof on the side of the electronic module 2, with a step (not shown) on which the end of the electronic module 2 on the side opposite the fitting side of the same is rested. This can prevent longitudinal deflection or deformation of the electronic module 2. The fitting of the rectifying plate 38 to the connector 1 is performed by the following steps. After the connector 1 fitted with the electronic module 2 is mounted on the mother board 3, parallel portions of the rectifying plate 38 at both ends thereof are inserted in between the arms 12, 13 and the end of the electronic module 2 on the side opposite the fitting side of the same is rested on the step (not shown) of the plate material 381. Then, the legs 382, 383, 384 are fixed on the mother board 3 by a proper means such as an adhesive bond.

The rectifying plate (rectifying means or supporting means) 39 of FIG. 5 is formed into one piece by use of metal such as aluminum, including an upper plate 391, an intermediate plate 392 and a lower plate 393, and side plates 394, 395 at both ends of the rectifying plate, and three partition plates 396 for dividing into four parts. The side plates 394, 395 have a configuration to extend in opening toward outside so that the air flowing together with the airstream 32 can easily be taken in toward the bottom surface of the electronic module 2. The intermediate plate 392 is provided, at an end thereof on the side of the electronic module 2, with a step (not shown) on which the end of the electronic module 2 on the side opposite the fitting side of the same is rested. An air inlet for the top surface of the electronic module 2 is formed between the upper plate 391 and the intermediate plate 392. An air inlet for the bottom surface of the electronic module 2 is formed between the intermediate plate 392 and the lower plate 393. When the intermediate plate 392 of the rectifying plate 39 is so structured as to contact with the electronic module 2 and the entire rectifying plate 39 is formed of metal, the rectifying plate 39 carries out a function of a heat sink that takes heat in from the electronic module 2 and radiate heat from that plate. The fitting of the rectifying plate 39 to the connector 1 is performed by the same steps as in the-fitting of the rectifying plate 38 of FIG. 4.

Figure 6:
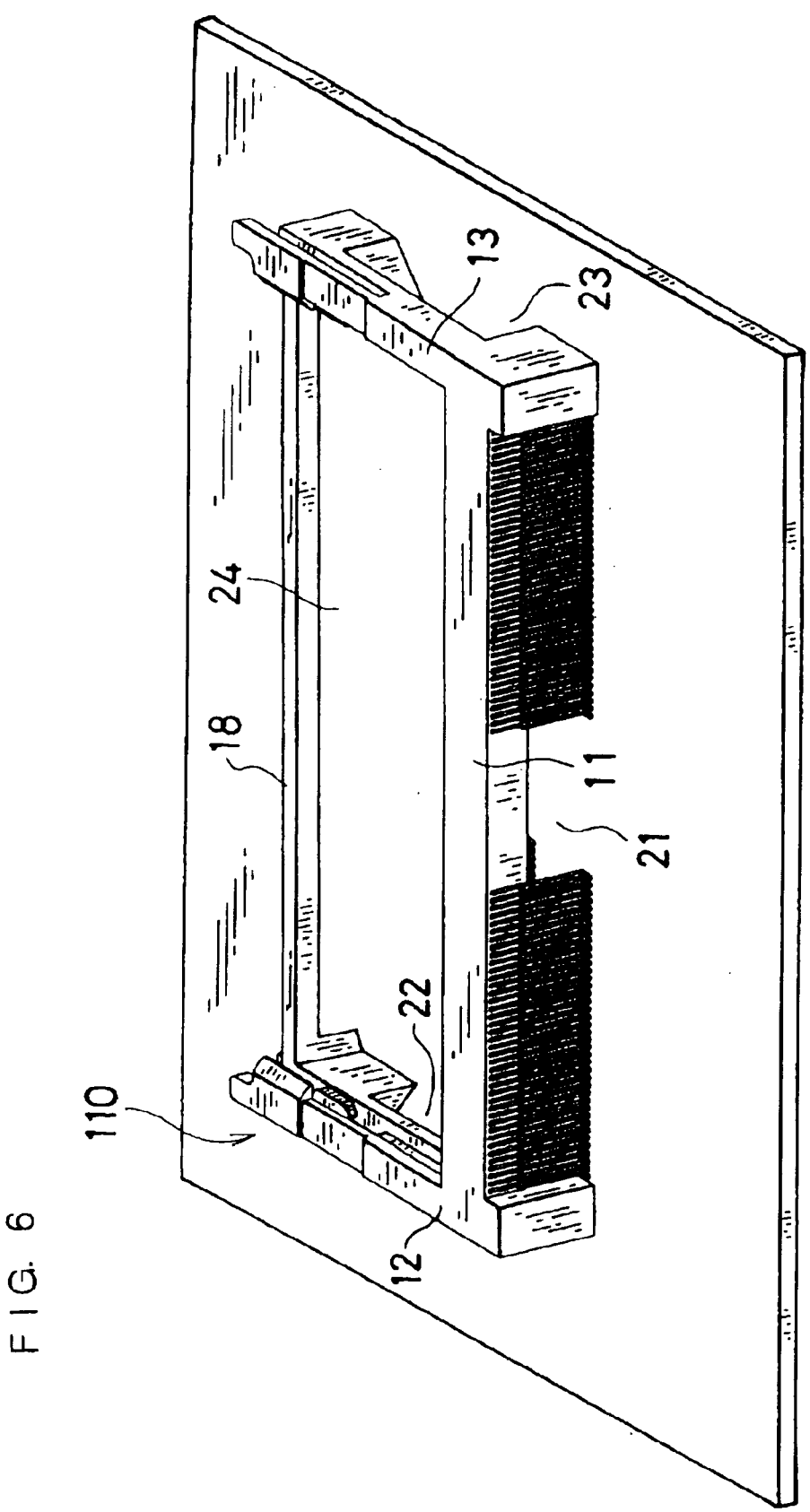
FIG. 6 is a perspective view showing a connector of another embodiment according to the first embodiment of the invention.

Shown in FIG. 6 is a housing (housing means) 110 of a quadrangle form. The housing 110 comprises the main body 11, the pair of arms 12, 13 integrated with the main body 11 at the both ends, and a seating 18 integrated with the arms 12, 13 at the ends. The seating 18 has a ventilation hole 24 formed thereunder so that airstream can be produced passing from the ventilation hole 24 through the first ventilation hole 21 and the second ventilation holes 22, 23.

Figure 7:
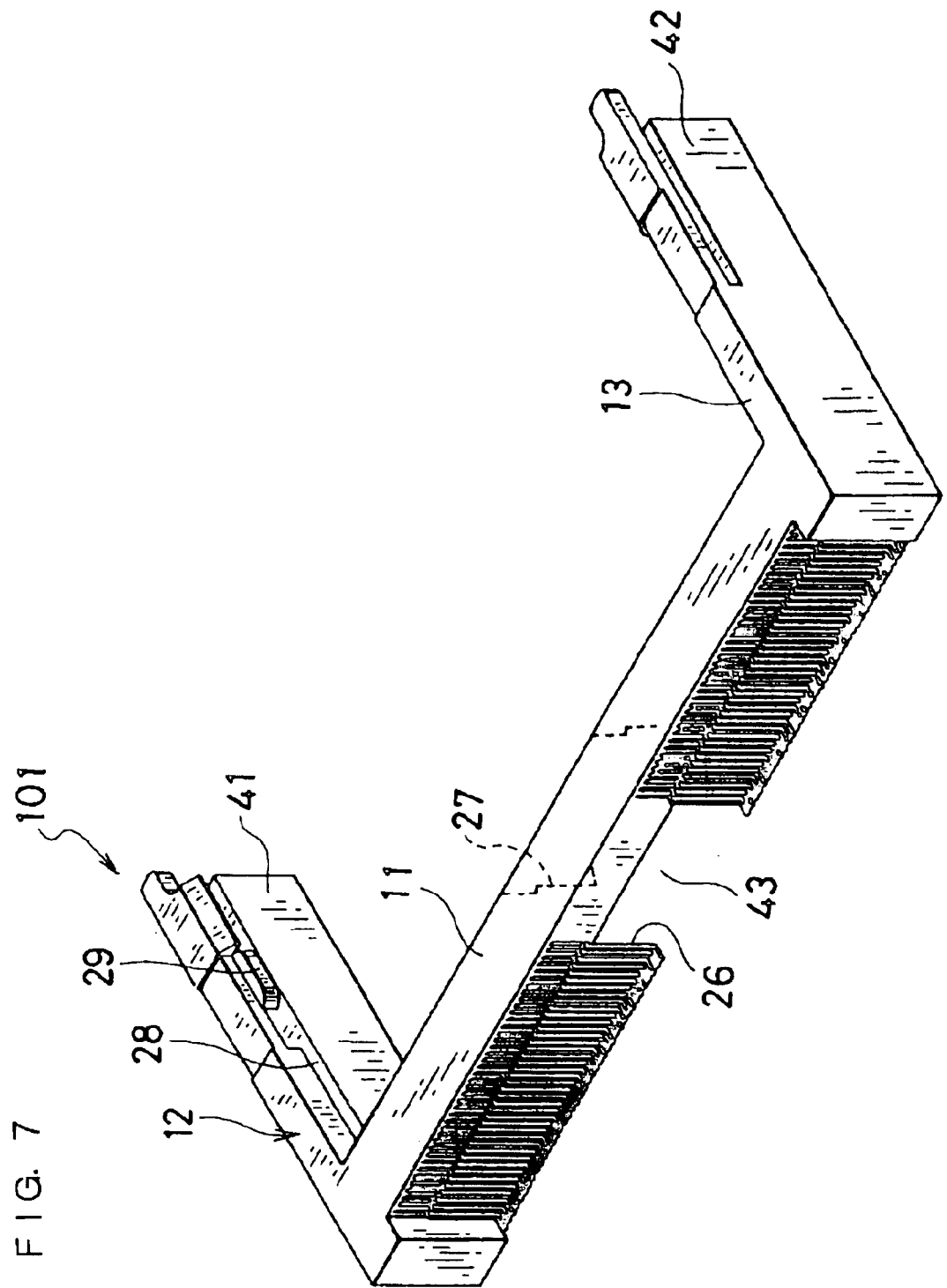
FIG. 7 is a perspective view showing a connector of the second embodiment of the invention.

Referring to FIG. 7, there is shown a perspective view of a connector 101 of the second embodiment corresponding to the third aspect of the invention, having a structure suitable for air to flow in a short side direction of the electronic module.

The connector 101 of FIG. 7 is different from the connector 1 of FIG. 1 in that in place of the base portions 14–17 provided under the arms 12, 13, a wall member (wall means) 41, 42 is provided under each of the arms 12, 13. As the remaining structures of the connector 101 are identical to those of the connector 1 of FIG. 1, like elements are given like reference characters but instead the detailed description is omitted.

The wall members 41, 42 provide a ventilation hole (ventilation means) 43 formed only under the main body 11 but serve as a guide of a side surface of the ventilation hole 43. It is preferable that the wall member 41, 42 and the arms 12, 13 are formed into one by use of resin and the like, and also the arms 12, 13 and the main body 11 are formed into one by use of resin and the like. Modification may be made by separately formed wall members 41, 42 being fitted into bottoms of the arms 12, 13 of an integrally molded product of the main body 11 and arms 12, 13.

When the electronic module (not shown) is fitted to the connector 101, the bottom surface of the electronic module is raised from the mother board (not shown), so that a airflow flowing toward the ventilation hole 43 is produced. By using two or more connectors 101 each having the ventilation hole 43 only under the main body 11, the arrangement can be provided in which two or more connectors each fitted with the electronic module can be arranged with their main bodies 11 aligned on the mother boad (not shown) in parallel so that a common airstream running through the ventilation holes 43 can be provided. In addition to or in place of the ventilation hole 43 provided under the main body 11 and the wall members 41, 42 provided under the pair of arms 12, 13, an upper ventilation hole and upper wall members may be provided at the main body 11 and the pair of arms, respectively, so that the airstream can run upward in a short side direction of the electronic module.

Figure 8:
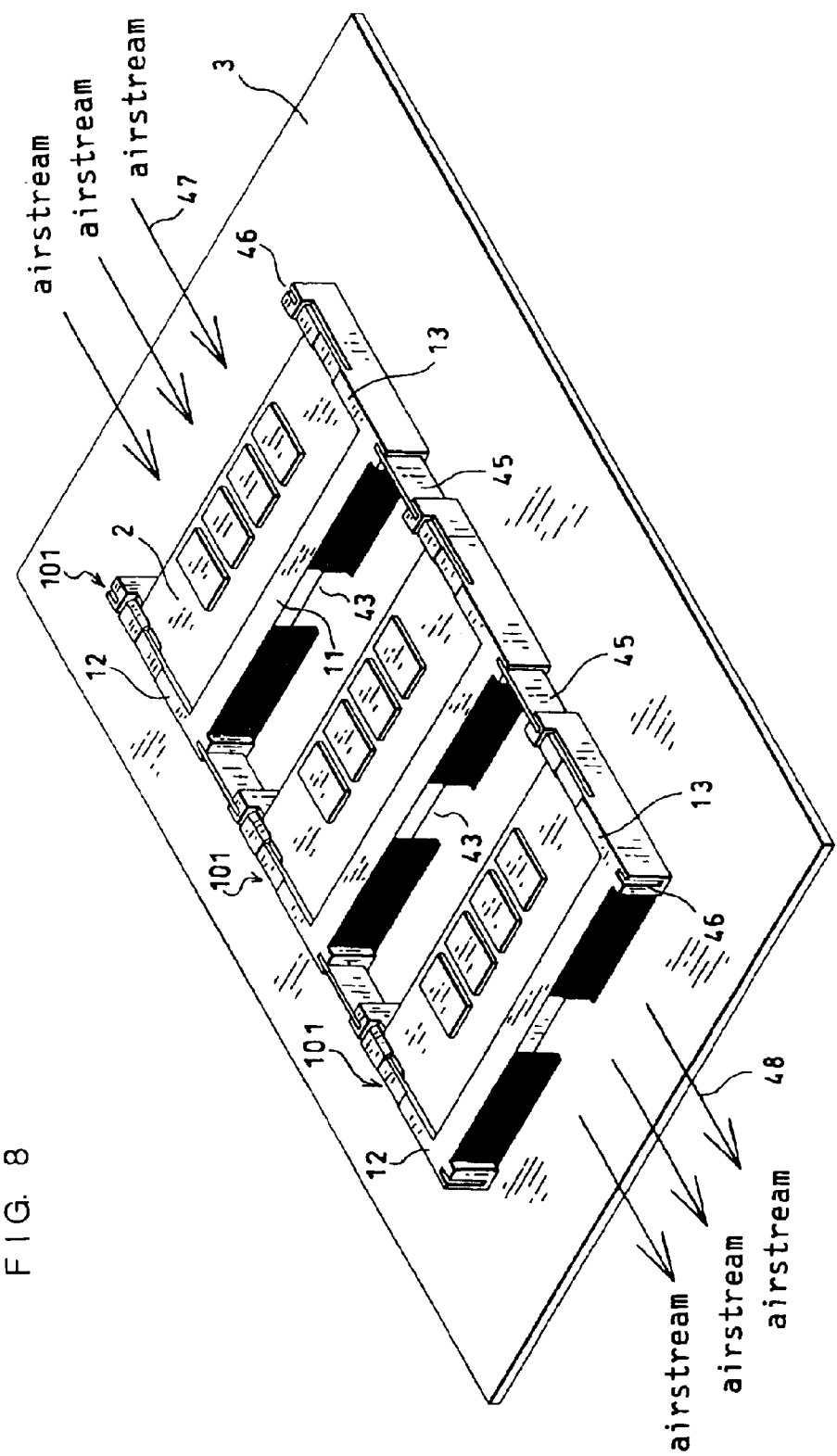
FIG. 8 is a perspective view showing the state in which two or more connectors fitted with the electronic modules are aligned in a row and their arms are connected to each other through wall members.

Shown in FIG. 8 is the state in which a plurality of connectors 101 fitted with the electronic modules 2 are aligned in series and mounted on the mother board 3. The arms 12, 13 of each connector 101 are provided, at front and rear portions thereof, with slits 46 to attach separate, plate-like, wall members 45 thereto. As illustrated, three connectors 101 are aligned in series along the direction of the arms 12, 13 and mounted on the mother board 3. When the plate-like wall members 45 are inserted in the slits 46 formed at the front and rear portions of the arms 12, 13 of the adjacent connectors 101, the arms 12, 13 of the adjacent connectors 101 are connected with each other.

As illustrated, the part of airstreams 47 from the rear ends of the arms 12, 13 of the first connector 101 runs out from the ventilation hole 43 provided under the main body 11, passing through the bottom surface of the electronic module 2. The airstream from the ventilation hole 43 of the first connector 101 enters the second connector 101. The airstream running out from the ventilation hole 43 of the second connector 101 enters the third connector 101 and flows out from the ventilation hole 43 of the third connector 101 as the airstream 48. The wall members 45 linking the arms 12, 13 of the adjacent connectors 101 and closing the gaps between the adjacent connectors each other 101 facilitate the stream from the airstream 47 to the airstream 48.

Figure 9:
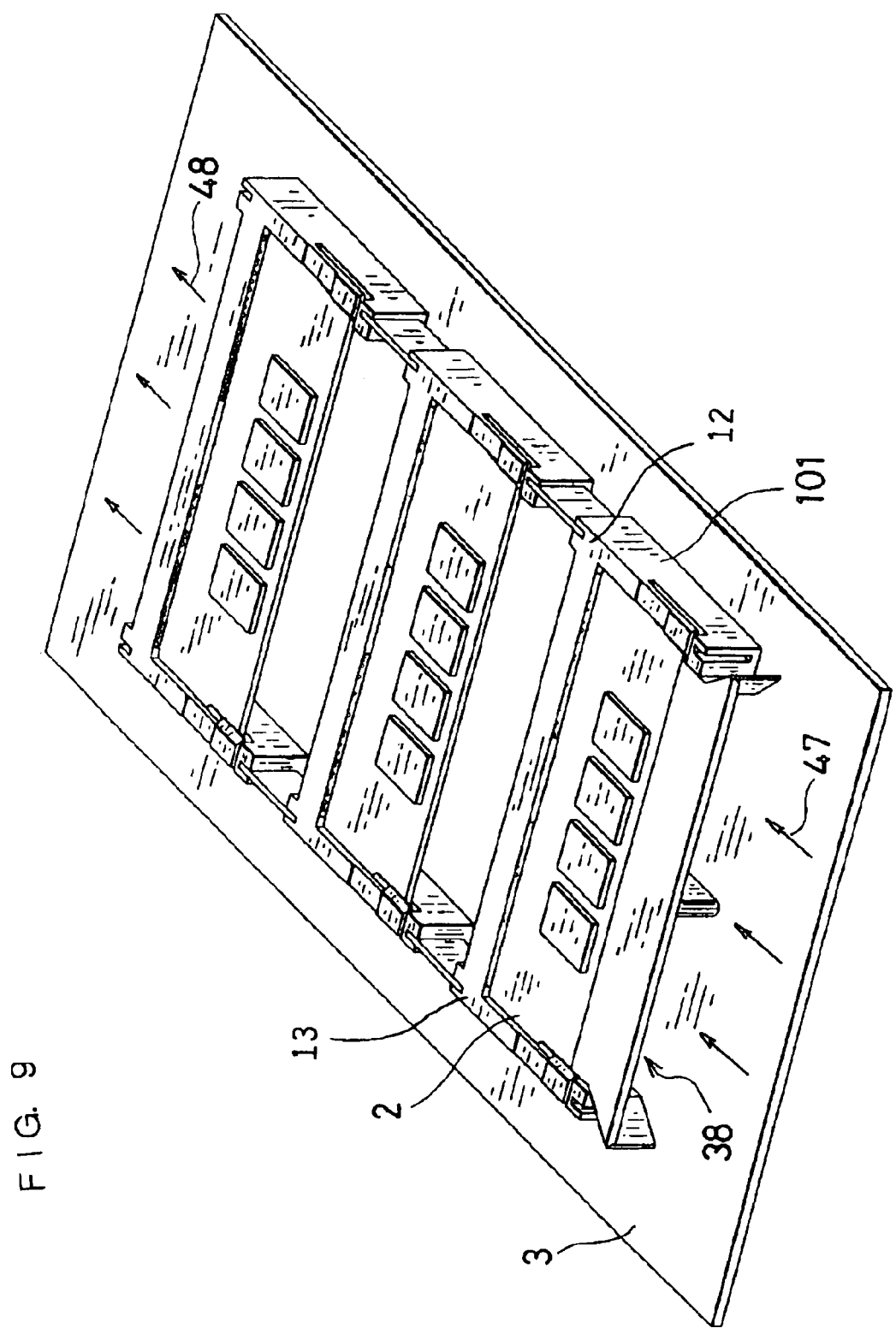
FIG. 9 is a perspective view showing the state in which the rectifying means is mounted on the inlet side of the row of connectors.

In order to facilitate taking in the airstream 47 running from the first connector 101 located at the most upstream side of the airstream 47, a rectifying plate (rectifying means) 38 is preferably provided at an end of the electronic module 2 on the side opposite the fitting side of the same with respect to the arms 12, 13, as shown in FIG. 9. The rectifying plate 38 doubles as supporting means to rest thereon the end of the substrate of the electronic module 2 and has the same detailed structure as the one illustrated in FIG. 4. In place of the rectifying plate 38 of FIG. 4, the rectifying plate (rectifying means) 39 of FIG. 5 may be attached to the first connector 101 of FIG. 9.

Figure 10:
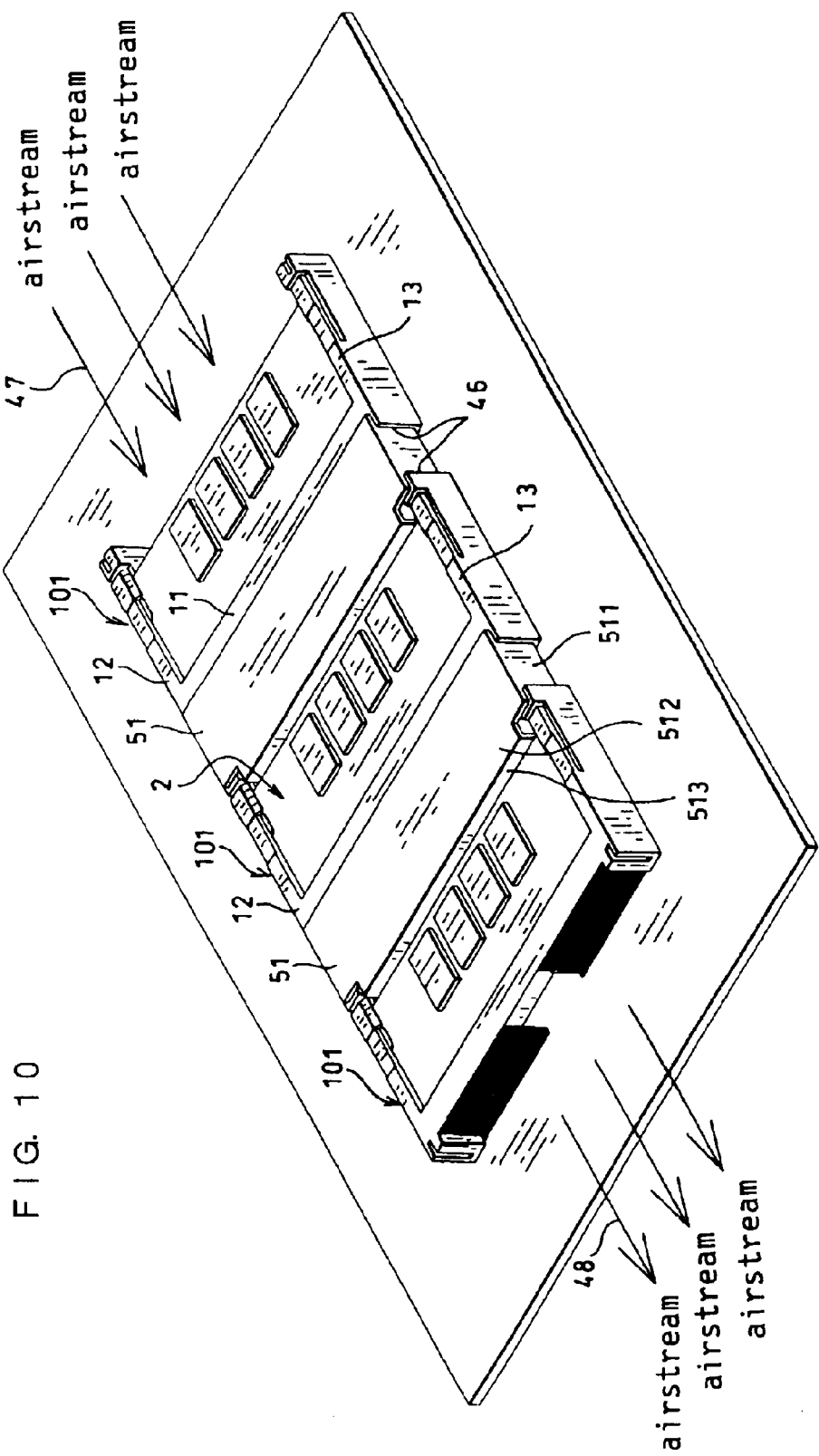
FIG. 10 is a perspective view showing the state in which upper plates are attached to cover the topside space between the connectors of FIG. 8 aligned in a row.

Referring to FIG. 10, there is shown the state in which covers 51, each doubling as the wall member, are attached to close topside spaces between adjacent connectors 101 coupled together through the wall members 45 of FIG. 8. Each cover 51 is formed into one, including a wall portion 511, an upper plate 512 and a bent portion 513. The wall portion 511 is fitted in the front and rear slits 46 at the arms 12, 13 of the adjacent connectors 101 to close the gap between the adjacent connectors 101 at each side thereof. The upper plate 512 closes the topside space between the main body 11 and the electronic module 2 in the adjacent connector 101. The bent portion 513 bridges a gap at the stepped portion extending from the arms 12, 13 to the electronic module 2. The attachment of the cover 51 permits almost all of the air taken in by the first connector 101 located at the most upstream side of the airstream 47 to flow out as the airstream 48, passing through the second and third connectors 101.

Figure 11:
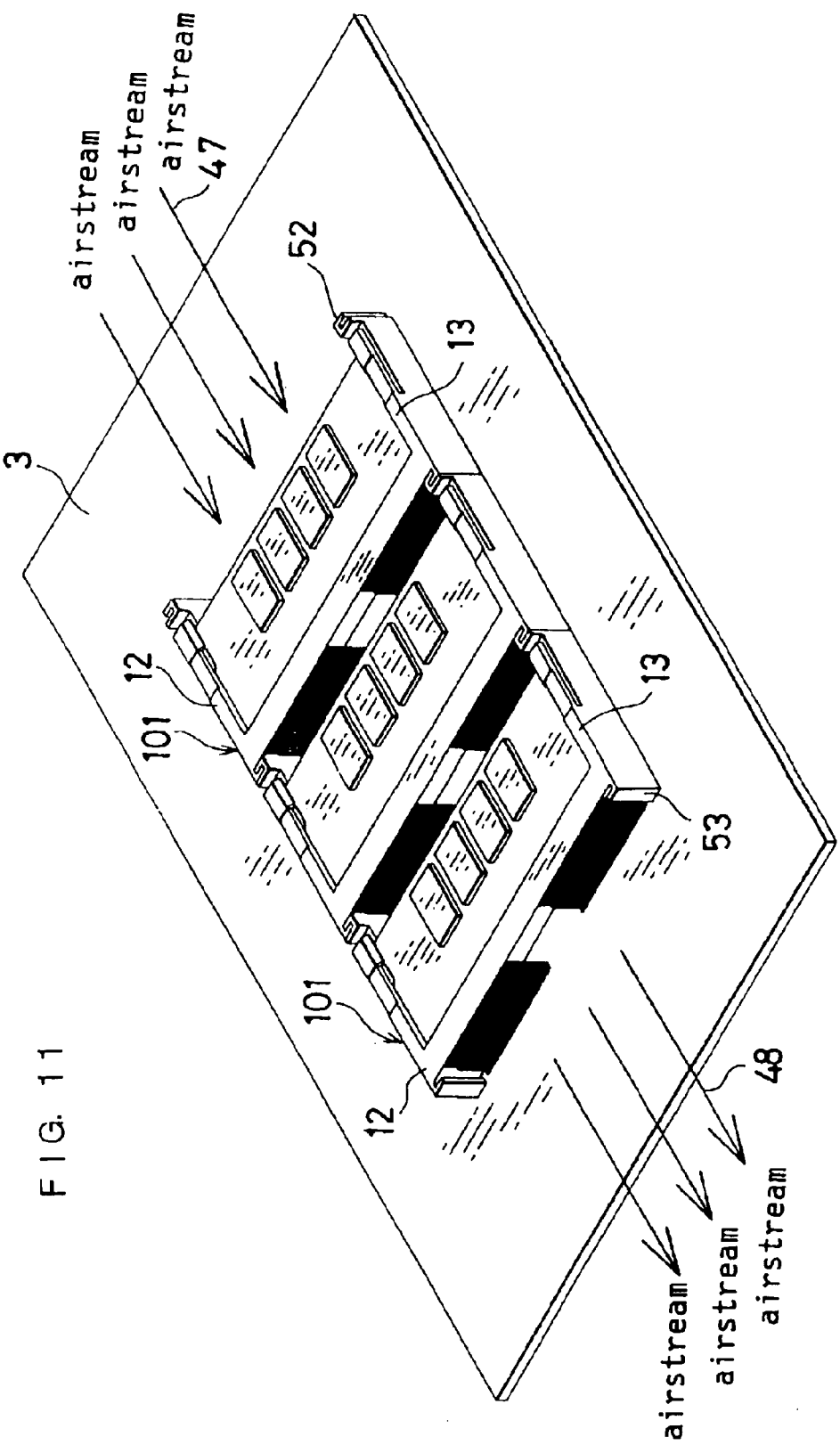
FIG. 11 is a perspective view showing the state in which two or more connectors fitted with the electronic modules are aligned in a row and their arms are directly coupled to each other through engaging portions thereof.

Referring now to FIG. 11, there is shown an arrangement in which the arms 12, 13 of the adjacent connectors 101 are directly coupled together. The arms 12, 13 have female engaging portions 52 formed at rear ends thereof and male engaging portions 53 formed at front ends thereof. After one connector 101 is mounted on the mother board 3, the other connector 101 is pushed down on it from above, so that the female engaging portions 52 and male engaging portions 53 are brought into engagement with each other to couple the adjacent connectors 101 with each other. The coupling of the arms 12, 13 of the adjacent connectors 101 among themselves eliminates the need for the separate wall members 45 as shown in FIG. 8 and produces a reduced topside space between the adjacent connectors 101. A top plate for closing the topside space between the adjacent connectors 101 may be provided, as necessary.

Figure 12:
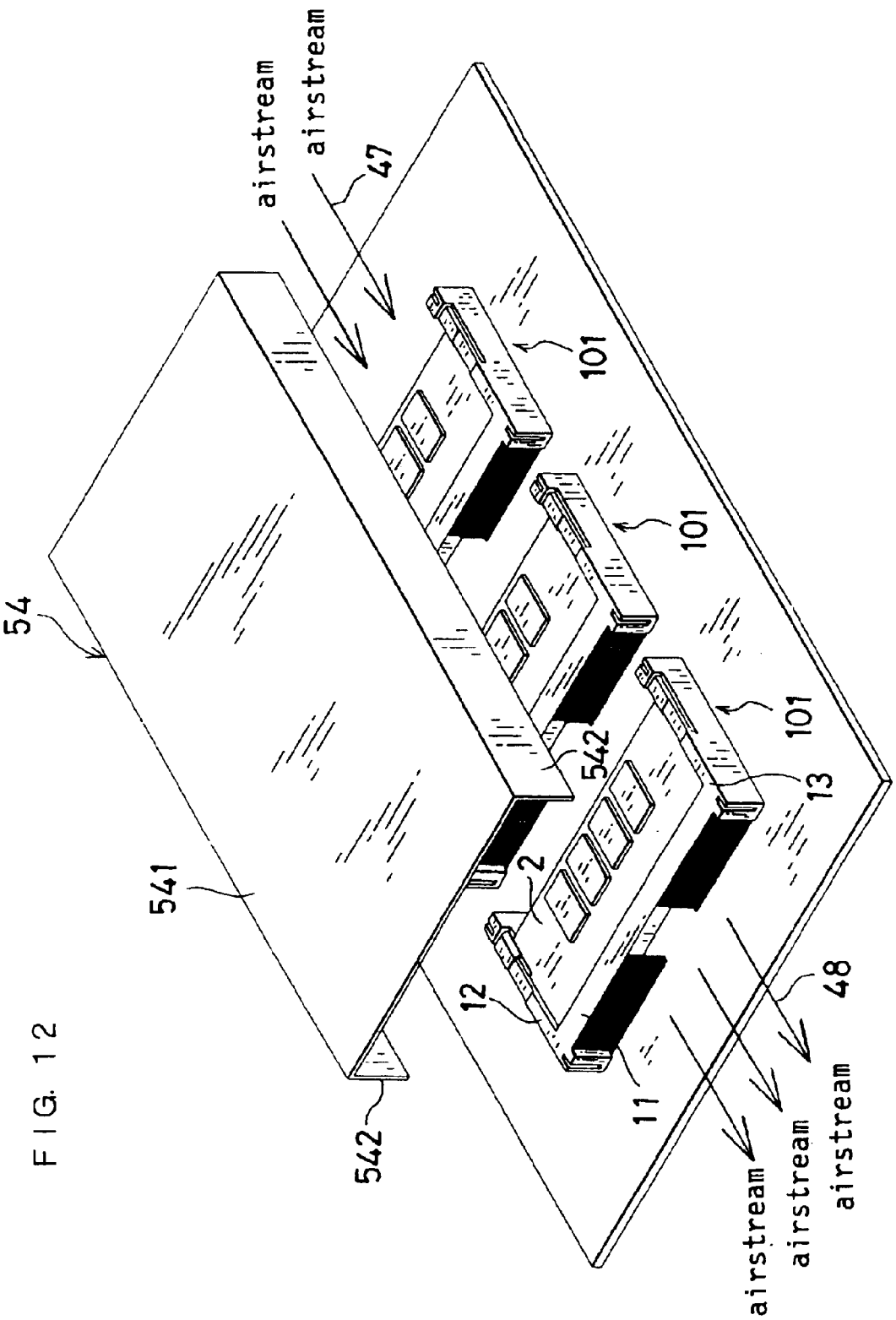
FIG. 12 is a perspective view showing the state in which two or more connectors fitted with the electronic modules are aligned in a row and a cover is put thereon.

Referring to FIG. 12, there is shown an arrangement that can facilitate the stream from the airstream 47 to the airstream 48 by mounting a separate cover 54 on the mother board 3, rather than coupling the adjacent connectors together. The arms 12, 13 of the adjacent connectors 101 are not coupled with each other but are spaced apart from each other. The cover 54 comprises an upper plate 541 and both side plates 542. A plurality of connectors 101 fitted with the electronic modules 2 are aligned in series and mounted on the mother board 3, as illustrated. The cover 54 is laid over the plurality of connectors 10t and fixed on the mother board 3. An air blowing means (not shown) is set in place against the ventilation hole of the connector 101 located at the most upstream side or an air suction means (not shown) is set in place against the ventilation hole of the connector 101 located at the most downstream side. The each side plate 542 has a height to leave an adequate space between the upper plate 541 of the cover 54 and the main body 11, so that the stream from airstream 47 to airstream 48 is produced on the top surface of the electronic module 2 as well. The side plates 542 of the cover 54 are placed in close vicinity to the arms 12, 13, so that the airstream 47 taken in the bottom surface of the electronic module 2 passes from the first connector 101 on the upstream side to the third connector 101 on the downstream side in a sequential order and flows out as the airstream 48. In place of the cover 54, a part of case of a notebook-sided personal computer may be used.

Any of the connectors 101 of FIGS. 8 to 12 permits air to flow, Passing through the ventilation hole 43 under the main body 11 of FIG. 7. While a number of front contacts 26 and rear contacts 27 are arranged in standing position in the ventilation hole 43, air flow through between adjacent rear contacts 27 as well as between adjacent front contacts 26. Referring to FIGS. 13 to 18, contact structures that can facilitate the stream of airstream and also can prevent air-borne dust collecting at the front and rear contacts 26, 27 will be described below.

FIG. 13 is a partially enlarged view of front and rear contacts 26, 27 extending downward from the main body 11. There are provided sufficient gaps between the adjacent contacts 26, 27 with respect to the arraying direction so that the airstream can run through the gaps. However, since a number of contacts 26, 27 stand in airstream's path, some turbulence is produced in front and rear of the contacts 26, 27 to increase the pressure loss. In order to reduce the pressure loss, downward extending portions of the contacts 26, 27 should preferably be streamlined in section.

FIG. 14 show some preferred examples of streamlined configuration. FIG. 14(a) shows the contacts 26, 27 having a rhombic section. This configuration can reduce the turbulence in front and rear of the contacts 26, 27 even when the air flows from either front or rear direction. FIG. 14(b) shows the contacts 26, 27 having a section of combination of semicircle and rectangle. This configuration can also reduce the turbulence in front and rear of the contacts 26, 27 even when the air flows from either front or rear direction. FIG. 14(c) shows the contacts 26, 27 having a section of combination of triangle and rectangle. This configuration can reduce the turbulence in front and rear of the contacts 26, 27 when air flows toward the triangle projection.

Figure 15:
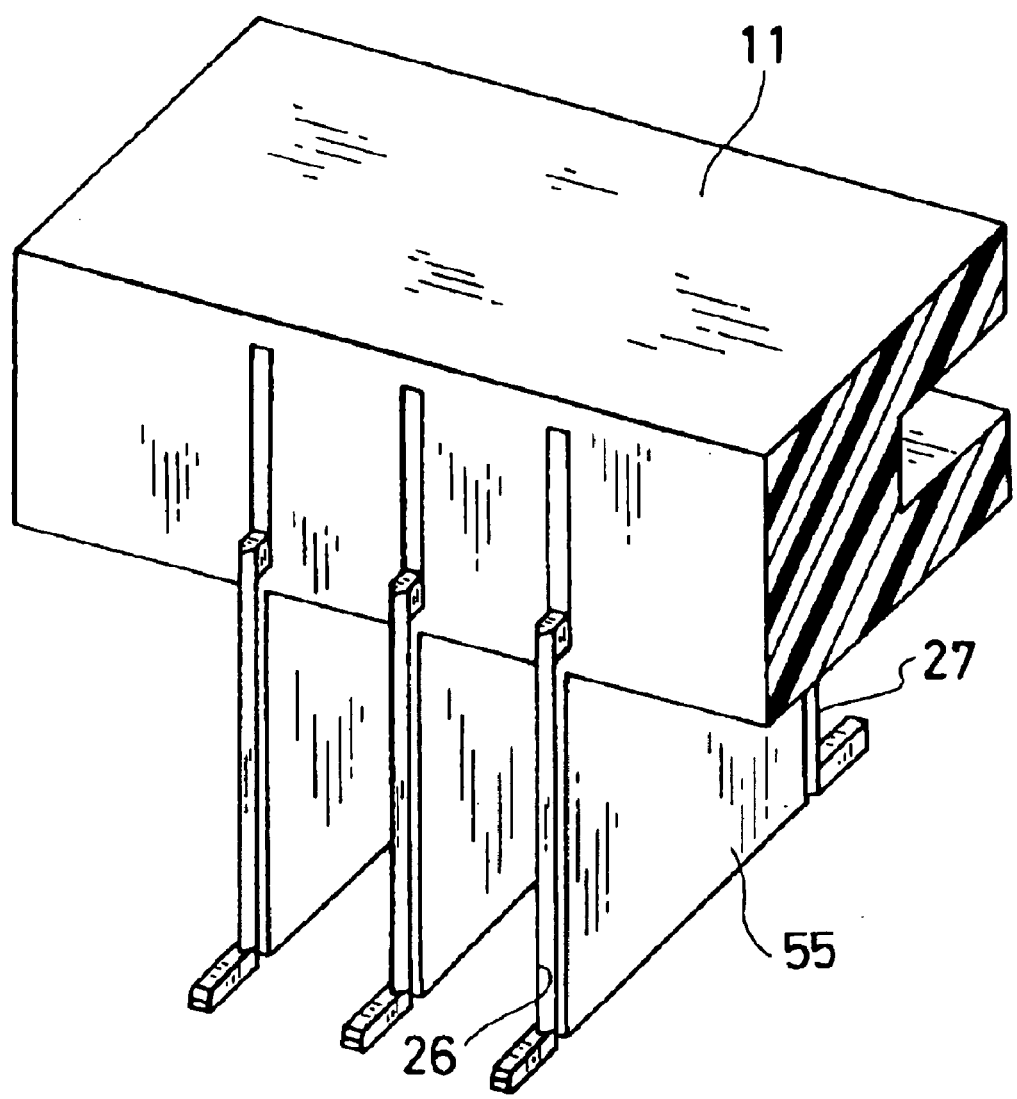
FIG. 15 is a perspective view showing closure means provided between the front and rear contacts extending downward from the main body.

FIG. 15 shows the arrangement in which thin plates (closure means) 55 to close narrow spaces between the front contacts 26 and the rear contacts 27 are provided therebetween. The thin plates 55 are integrally molded with the main body 11. The closing of the narrow spaces between the front and rear contacts 26, 27 by the thin plates 55 serves the function of preventing collection of dust at the contacts 26, 27 as well as occurrence of the turbulence originating from the contacts 26, 27. In the combination of the thin plates 55 with the contacts, the contacts 26, 27 should preferably have a streamlined section at downward extending portion thereof, through even the non-streamlined contacts can substantially serve the function noted above.

Figure 16:
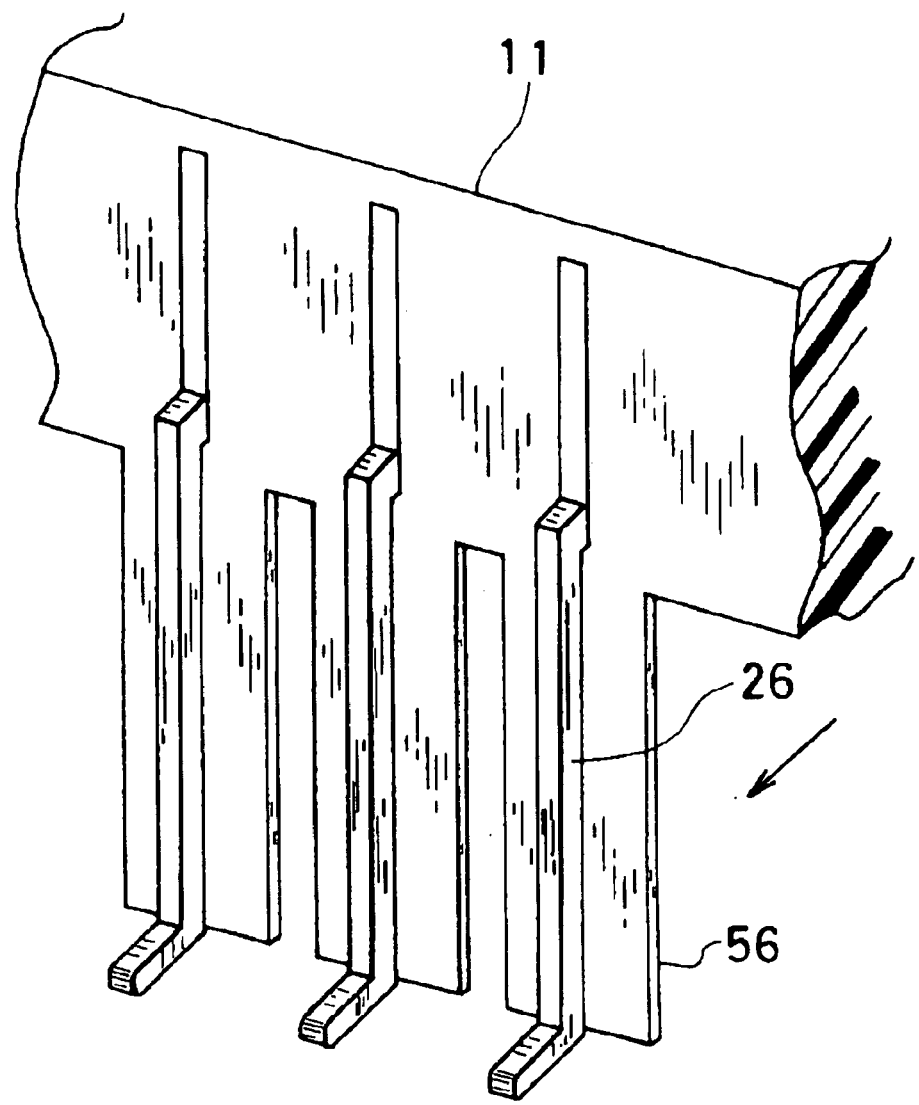
FIG. 16 is a perspective view showing dustproof means provided at the front and rear contacts extending downward from the main body.

FIG. 16 shows combination of the front contacts 26 with a dustproof plate (dustproof means) 56. The plate 56 is integrally molded with the main body 11. The plate 56 which is to windward of the front contacts 26 can prevent collection of dust between the adjacent front contacts 26 to prevent short-circuit. Though the plate for the rear contacts 27 is not shown, the same plate should preferably be to windward of the rear contacts. The plate on the windward side of the rear contacts 27 can separately be mounted on the main body 11 after the contacts 27 are mounted on the main body 11.

Figure 17:
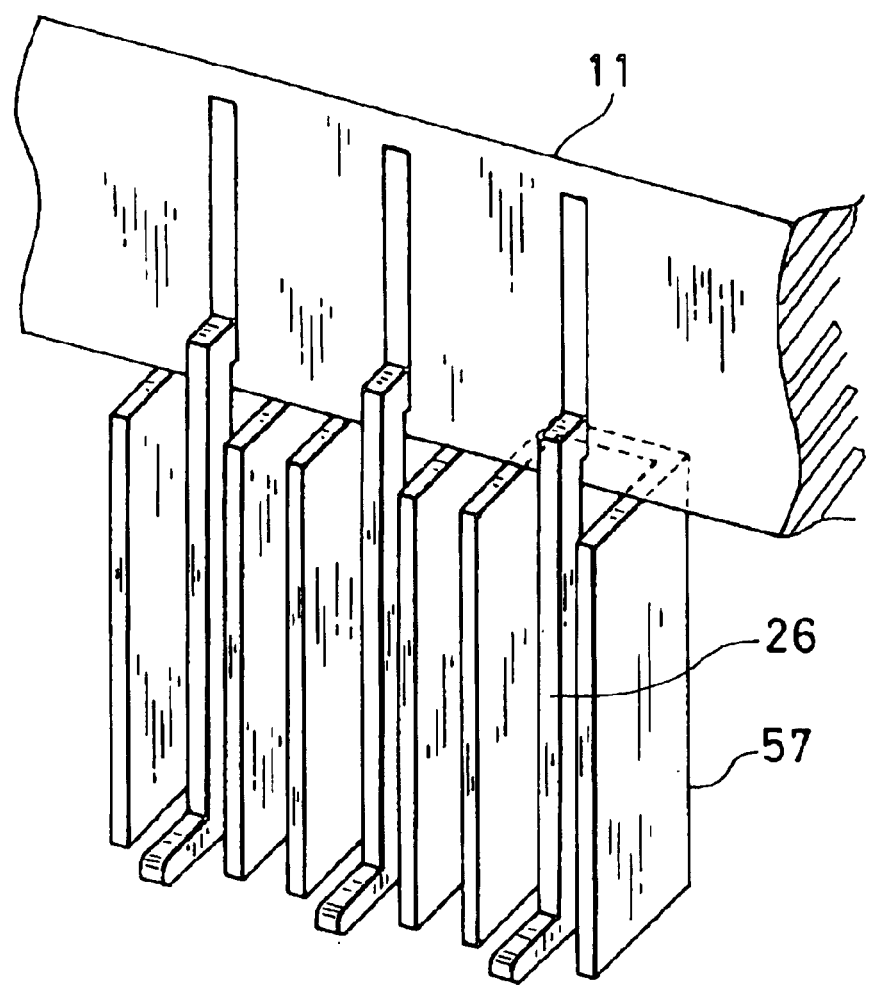
FIG. 17 is a perspective view showing another dustproof means provided at the front and rear contacts extending downward from the main body.

FIG. 17 shows combination of the front contacts 26 with dustproof enclosures (dustproof means) 57. The enclosures 57, each having a configuration to cover an upstream side of and both lateral sides of the front contact 26, are integrally molded with the main body It. The enclosures 57 can prevent collection of dust between the adjacent front contacts 26 to prevent short-circuit. Though the enclosures for the rear contacts 27 which are to be inside are not shown, the same enclosures opening to the leeward side should preferably be combined with the rear contacts. The enclosures on the windward side of the rear contacts 27 can separately be mounted on the main body 11 after the contacts 27 are mounted on the main body 11.

Figure 18:
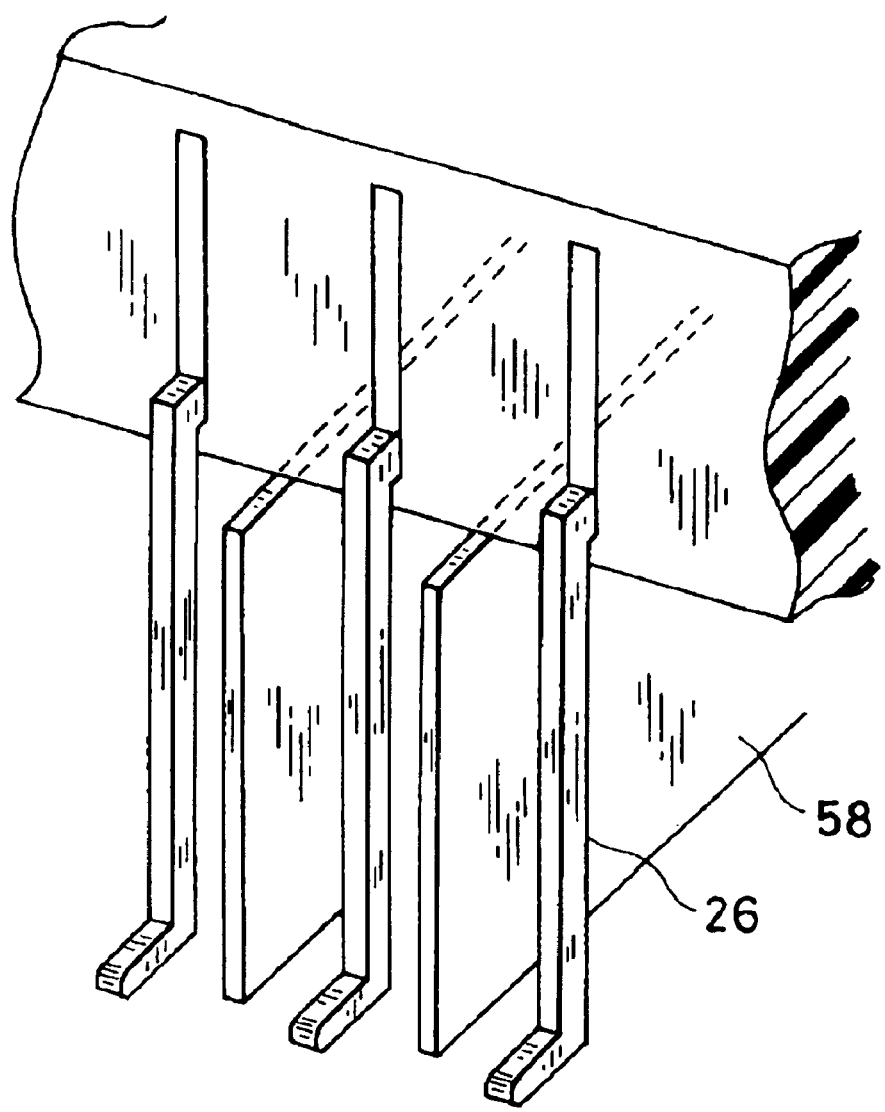
FIG. 18 is a perspective view showing dustproof partition means to partition adjacent contacts for each of the front and rear contacts extending downward from the main body.

FIG. 18 shows dustproof partition plates (partition means) 58 provided between adjacent front contacts 26. The partition plates 58 are integrally molded with the main body 11. The partitioning between the adjacent front contacts 26 can prevent dust being collected in relation to link between the adjacent front contacts 26. The partition plates 58 extends to between the rear contacts 27 located inside, to partition between adjacent the rear contacts 27.

While the spacer, the thin plate, the plate, the enclosure and the partition plate illustrated in FIGS. 13 to 18 are of suitable for the connector 101 of the second embodiment of FIG. 7, any of the spacer, the thin plate, the plate, the enclosure and the partition plate may be applied to the structure wherein the airstream passes through the first ventilation hole 21 provided under the main body 11, as in the connector 1 of the first embodiment of FIG. 1.

Figure 19:
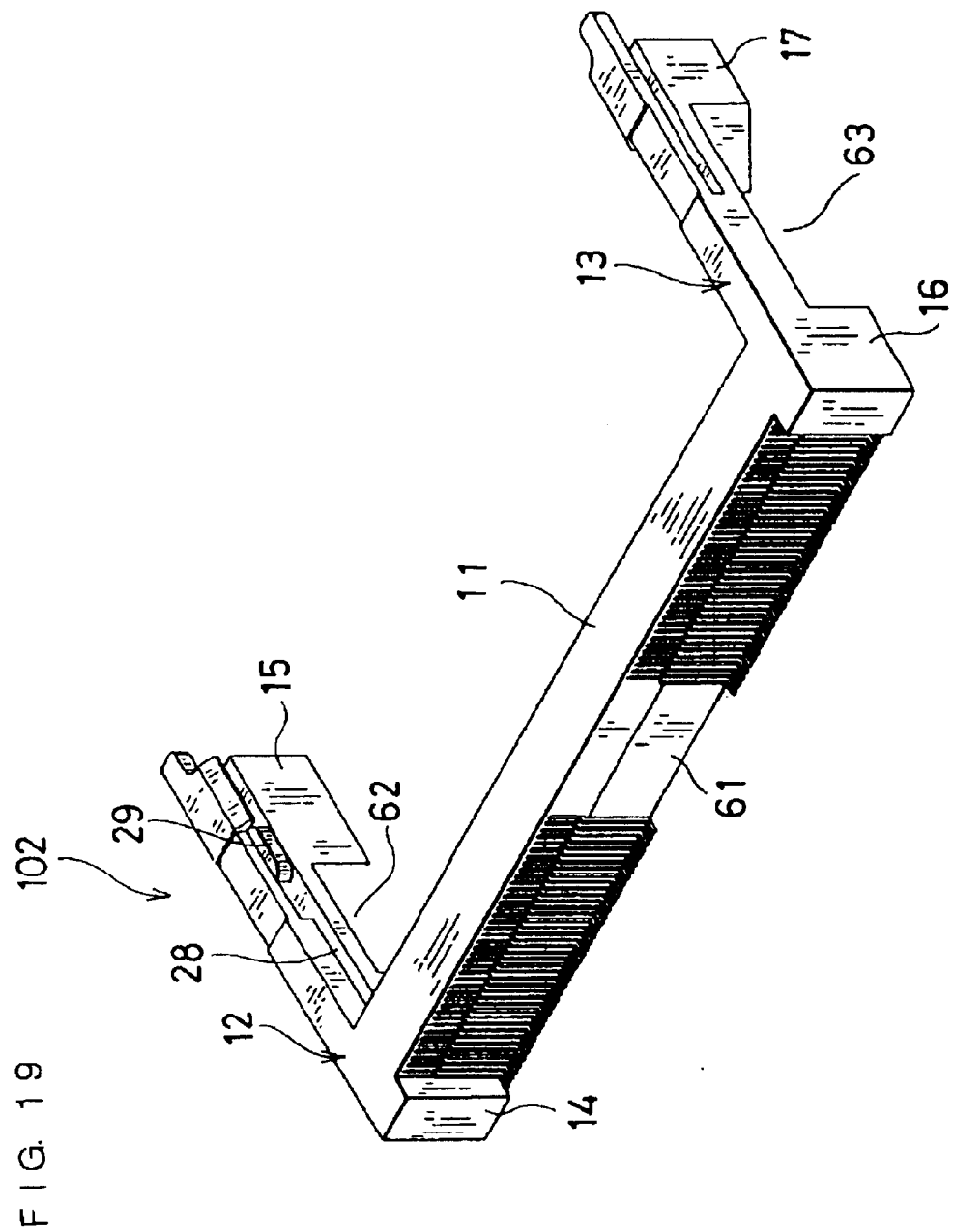
FIG. 19 is a perspective view showing the connector of the third embodiment of the invention.

Referring to FIG. 19, there is shown a perspective view of the connector 102 of the third embodiment corresponding to the fourth aspect of the invention, having the structure suitable for airstream to run in a longitudinal direction of the electronic module.

The connector 102 of FIG. 19 is different from the connector 1 of FIG. 1 in that a wall member (wall means) 61 is provided under the main body 11. As the remaining structures of the connector 102 are identical to those of the connector 1 of FIG. 1, like elements are given like reference characters but instead the detailed description is omitted.

The wall member 61 has the same height as the base portions 14, 15, 16, 17. For this, a pair of ventilation holes (ventilation means) 62, 63 are formed between the base portions 14, 15 and under the arm 12 and between the base portions 16, 17 and under the arm 13, respectively, The wall member 61 serves as a guide of one side surface of the ventilation holes 62, 63. It is preferable that the wall member 61 and the main body 11 are formed into one by use of resin and the like. Alternatively, the wall member 61 may be formed separately from the main body 11 and fitted into the bottom of the main body 11 of the integrally molded product of the main body 11 and arms 12, 13. If the wall member 61 under the main body 11 enables the connector 102 to be mounted on the mother board (not shown), then the base portions 14, 15, 16, 17 may be omitted.

When the electronic module (not shown) is fitted to the connector 102, the bottom surface of the electronic module is raised from the mother board (not shown), so that a airflow flowing from the ventilation hole 62 to the ventilation hole 63 and vice versa is produced. This permits the airstream to run along the electronic chips aligned longitudinally of the electronic modules. In addition to or in place of the wall member 61 provided under the main body 11 and the ventilation holes 62, 63 provided under the pair of arms 12, 13, an upper wall member and upper ventilation holes may be provided over the main body 11 and the pair of arms, respectively, so that the airstream can run upward in a long side direction of the electronic module.

Figure 20:
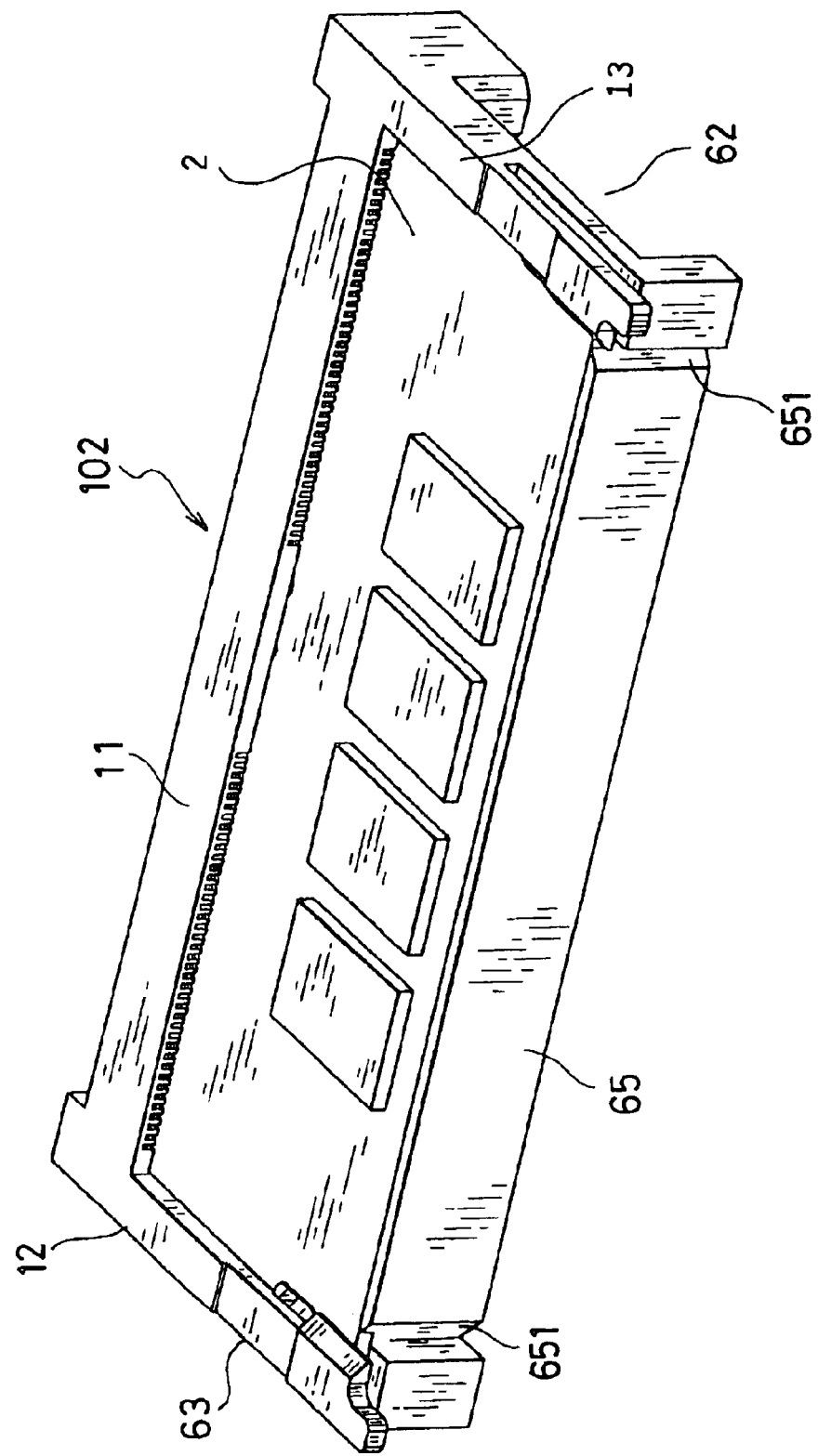
FIG. 20 is a perspective view showing the state in which rectifying means is mounted on the ends of the arms of the connector mounting the electronic modules thereon.

FIG. 20 shows a wall member 65 connecting between the ends of the arms 12, 13. After the electronic module 2 is fitted to the connector 102, the wall member 65 is fitted in between the opposing ends of the arms 12, 13. The wall member 65 is preferably provided with a step for resting thereon the end of the electronic module 2. This can reduce longitudinal deflection of the electronic module 2. The wall member 65 is preferably bent inwardly at both ends thereof to form bent portions 651. The bent portions 651 permits the rectifying of the airflow flowing from the ventilation hole 63 toward the ventilation hole 62. The fitting of the wall member 65 to the connector 102 is performed by the following steps. After the connector 102 fitted with the electronic module 2 is mounted on the mother board (not shown), the wall member 65 is fitted in between the opposing ends of the arms 12, 13 and the end of the electronic module 2 on the side opposite the fitting side of the same is rested on the step (not shown) of the wall member 65. Then, the bottom of the wall member 65 is fixed on the mother board (not shown) by a proper means such as an adhesive bond. With sandwiched in between the wall member 61 (not shown) provided under the main body 11 and the wall member 65, the stream of air through the ventilation holes 62, 63 under the arms 12, 13 is facilitated.

Figure 21:
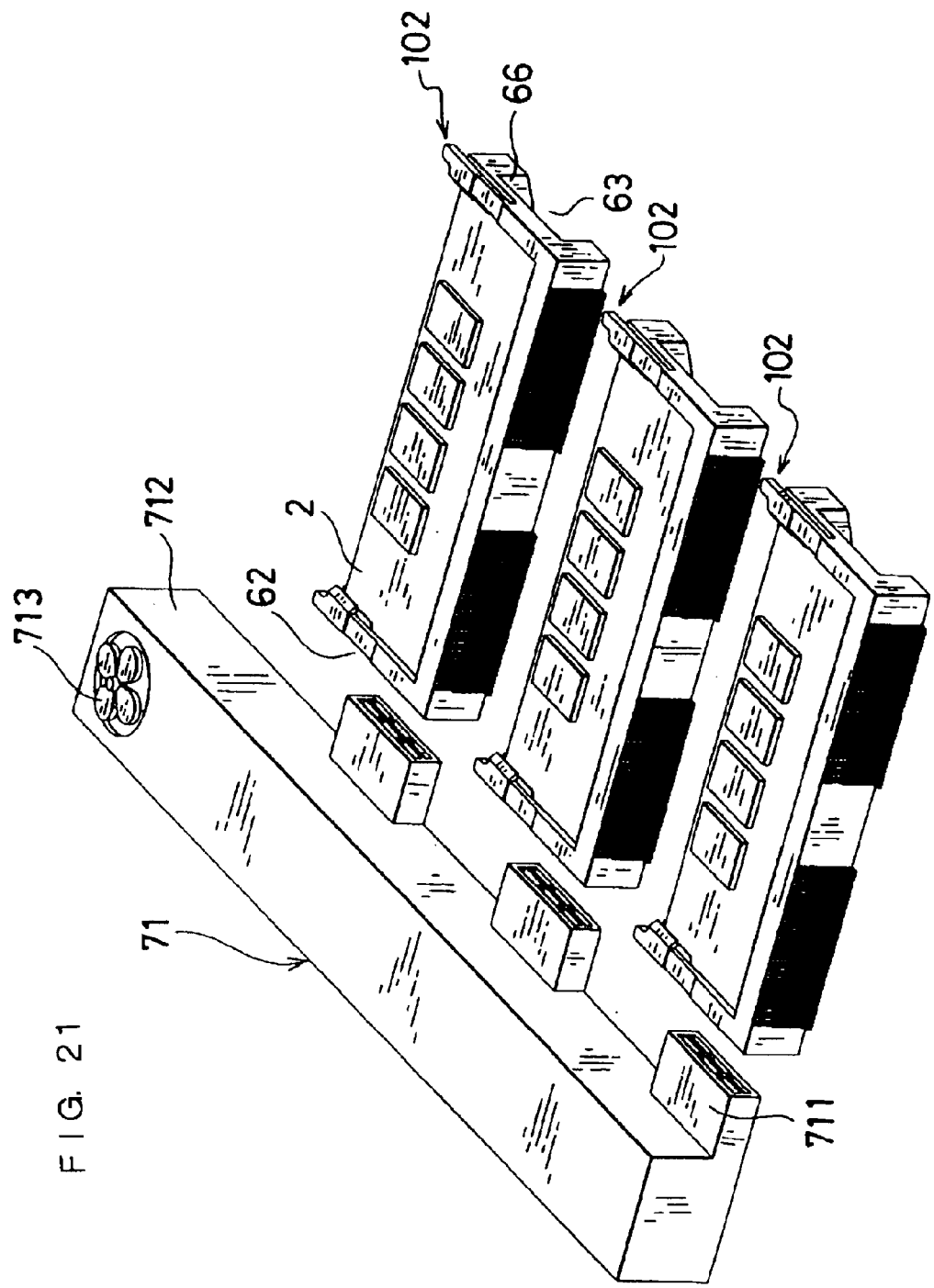
FIG. 21 is a perspective view showing the state in which two or more connectors fitted with the electronic modules are aligned in a row and suction means is fitted to the ventilation means provided under one of the arms.
Figure 22:
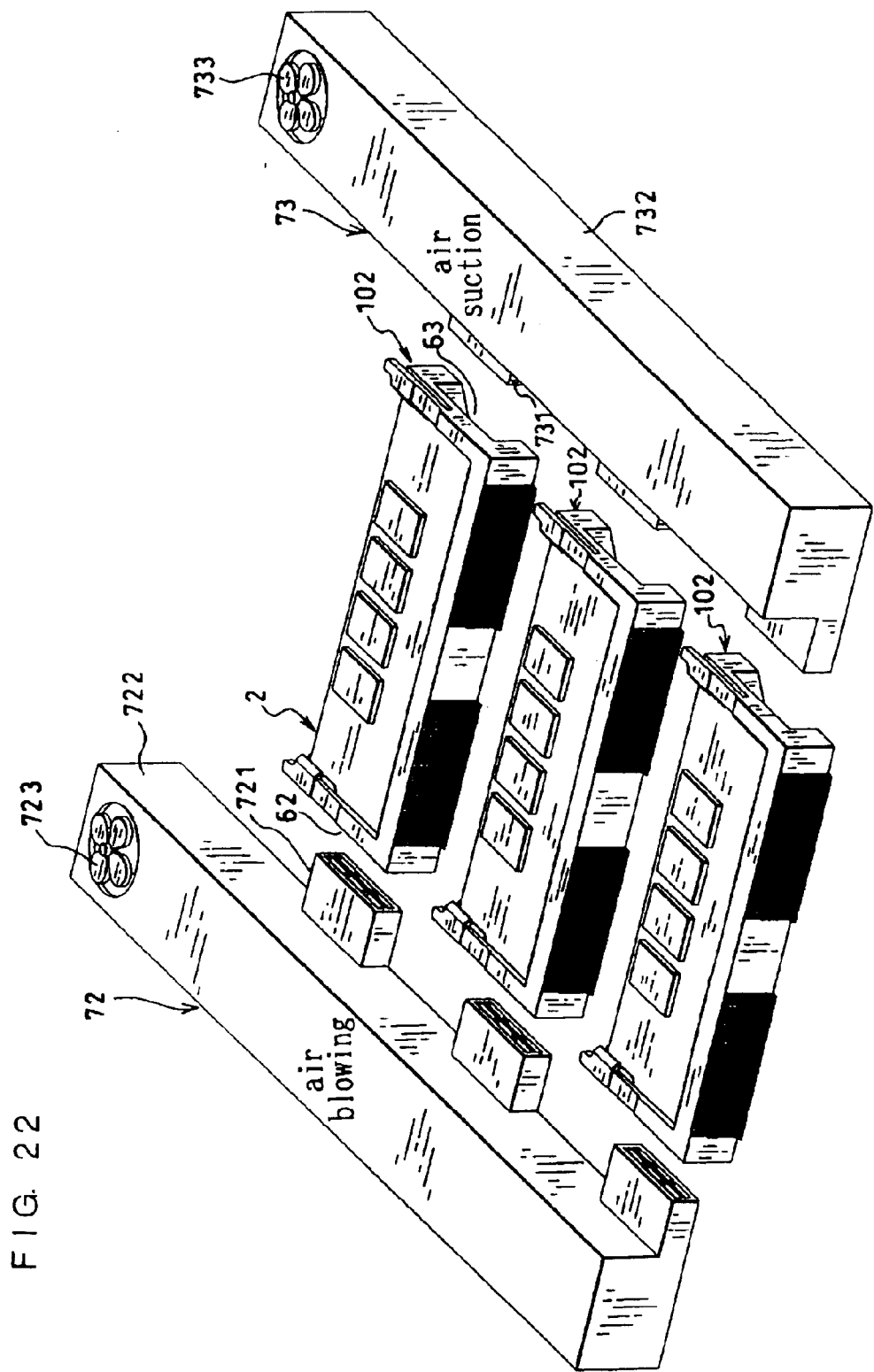
FIG. 22 is a perspective view showing the state in which two or more connectors fitted with the electronic modules are aligned in a row; the suction means is fitted to the ventilation means provided under one of the arms; and air blowing means is fitted to the ventilation means provided under the other of the arms.

FIGS. 21 and 22 show the embodiment corresponding to the fifth aspect of the invention in which an air suction means and an air blowing means are provided for forcibly producing the airstream running through the ventilation holes 62, 63 in the arrangement that a plurality of connectors 102 of FIG. 19 or of FIG. 20 are arranged in a row so that their main bodies 11 can be parallel with each other.

Referring to FIG. 21, the suction means 71 is connected with the one ventilation holes 62 of the connectors 102, with spaced therefrom. The suction means 71 comprises a duct entrance 711 for sucking air, a main duct 712 and a suction fan 713. The duct entrance 711 has a configuration corresponding to the one ventilation hole 62 of the connector 102. The air sucked from the duct entrance 711 flows through the main duct 712 and is drawn out by the suction fan 713. This produces the airflow going from the other ventilation hole 63 to the one ventilation hole 62, so that the electronic chips mounted on the bottom of the electronic module 2, in particular, are cooled. In order to facilitate taking in air from the other ventilation hole 63, the ventilation hole 63 preferably has a slanted surface 66 increasing in opening toward the outside. In place of the main duct 712, a part of a case of a notebook-sided personal computer may be used.

Referring now to FIG. 22, an air blowing means 72 is connected with the one ventilation holes 62 at one ends of the connectors 102, with spaced therefrom, and an air suction means 73 is connected with the other ventilation holes 63 of connectors 102, with spaced therefrom. The air blowing means 72 comprises a duct entrance 721 for blowing air, a main duct 722 and an air blowing fan 723. The duct entrance 721 has a configuration corresponding to the one ventilation hole 62 of the connector 102. The air fed from the air blowing fan 723 flows through the main duct 722 and is blown out from the duct entrance 721. The air suction means 73 comprises a duct entrance 731, a main duct 732 and an air suction fan 733. The duct entrance 731 has a configuration corresponding to the other ventilation hole 62 of the connector 102. The air blown out from the duct entrance 721 flows from the one ventilation hole 62 toward the ventilation hole 63 at the other end, and the air from the other ventilation hole 63 is sucked into the duct 731. This produces the airflow going from the one ventilation hole 62 to the other ventilation hole 63, so that the electronic chips mounted on the bottom of the electronic module 2, in particular, are cooled. In place of the main ducts 722, 723, a part of a case of a notebook-sided personal computer may be used.

The connection to the air blowing means and air suction means is applicable for the connectors of FIGS. 3 to 6 and of FIGS. 8 to 12.

Figure 23:
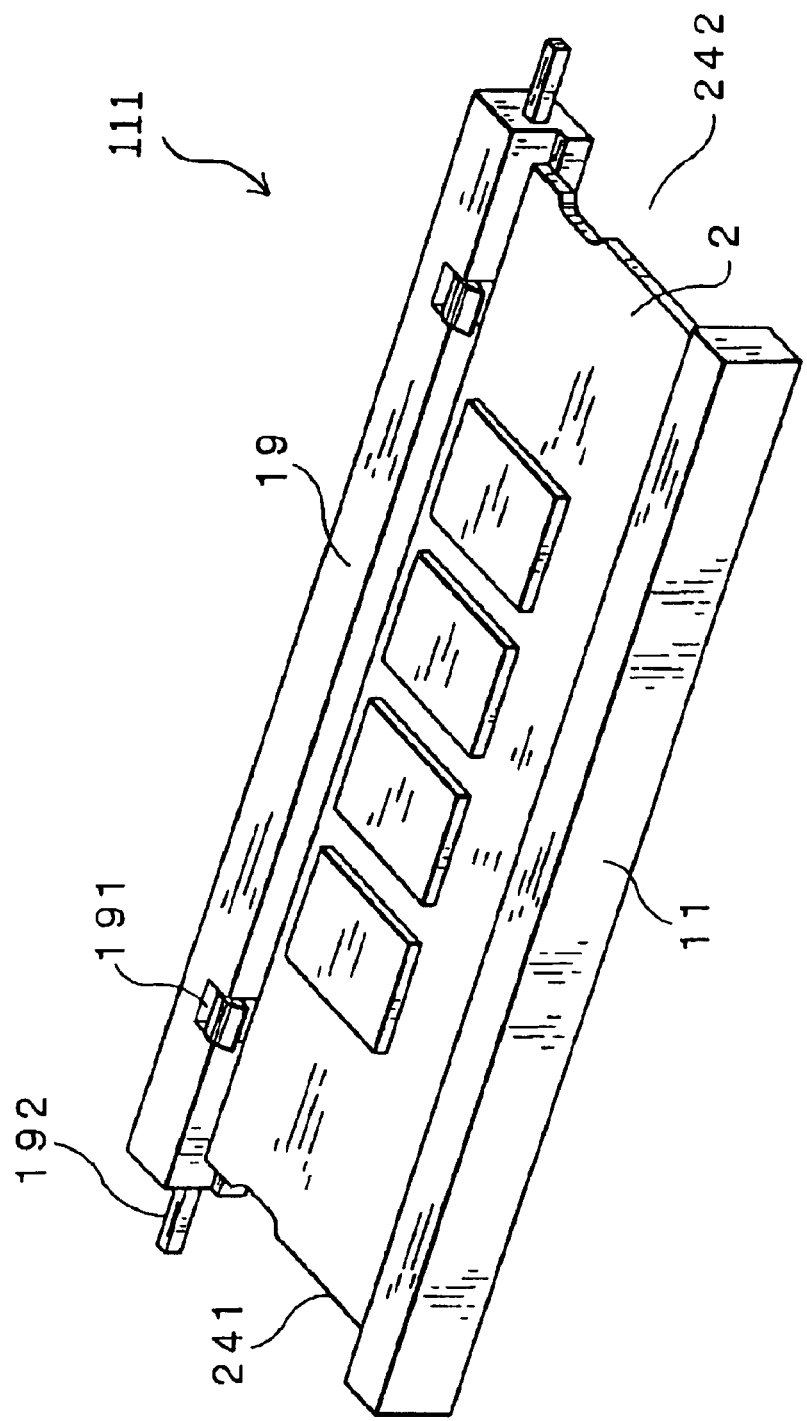
FIG. 23 is a perspective view showing the connector of a still another embodiment according to the third embodiment of the invention.

Shown in FIG. 23 is a connector 103 of another embodiment serving substantially the same function as the connector 102 of FIG. 19 and of FIG. 20. The housing (housing means) 111 comprises the main body 11 at the front end of the electronic module 2 and the supporting portion 19 at the rear end of the electronic module 2 which are separated from each other. A pair of ventilation holes 241, 242 are formed between the main body 11 and the supporting portion 19. The air passes through the pair of ventilation holes 241, 242.

The supporting portion 19 is provided with a locking means 191 for fixing the electronic module 2. The locking means 191 switches between the locking mode and the unlocking mode selectively by pressing a rod 192.

In the first to third embodiments, in place of the type of connector wherein the electronic module is fitted to the contacts by inserting the opposite ends of the electronic module into the slots 28 in the contacts, another type of connector wherein the electronic module is fixed to the locking means provided at the arms by inserting the electronic module obliquely toward the main body and then pressing it down toward the arms or still another type of connector wherein the electronic module is fitted to the contacts via a sliding plate may be used to put the invention into operation.

What is claimed is:

1. A connector for connecting a mother board to a plate-like electronic module with electrical conductive pads at an end part, comprising a housing and a first ventilation opening, wherein the housing is mounted on the mother board and provided with a main body and a pair of arms, the main body has one end adapted for electrical connection to the mother board and an opposite end adapted for electrical connection with the electrical conductive pads of the electronic module, the pair of arms extend from the main body securing the electronic module above the mother board a predetermined distance when the electrical conductive pads of the electronic module are connected to the contacts, the first ventilation opening is disposed under the main body and between a grouping of contacts adapted for electrical connection to the mother board to provide efficient cooling of the electronic module be allowing air to flow between the mother board and the electronic module and through the opening.

2. A connector according to claim 1, further comprising second ventilation openings, wherein the second ventilation openings are disposed under the pair of arms and provide efficient cooling of the electronic module by allowing air to flow between the mother board and the electronic module and trough the opening.

3. A connector according to claim 1, further comprising a rectifying member with an opening to take in air, wherein the rectifying member is installed at ends of said pair of arms to support an end part opposite to the connected end part of the electronic module.

4. A connector according to claim 1, further comprising a supporting member installed at ends of said pair of arms to support an end part opposite to the connected end part of the electronic module.

5. A connector according to claim 2, wherein at least one of the second ventilation openings has a configuration to extend in opening toward outside.

6. A connector for connecting a mother board and a plate-like electronic module with electrical conductive pads at an end part, comprising a housing, a ventilation opening and wall members, wherein the housing is mounted on the mother board and provided with a main body and a pair of arms, the wall members are provided under said pair of arms, the main body has one end adapted for electrical connection to the mother board and an opposite end adapted for electrical connection with the electrical conductive pads of the electronic module, the pair of arms extend from ends of the main body to secure the electronic module above the mother board a predetermined distance when the electrical conductive pads of the electronic module are connected to the contacts, the ventilation opening is disposed under the main body and between a grouping of contacts adapted for electrical connection to the mother board to provide efficient cooling of the electronic module by allowing air to flow between the mother board and the electronic module and through the opening.

7. A connector according to claim 6, further comprising attachment portions positioned at front and rear portions of said pair of arms to interconnect pair of arms of two or more adjacent connectors.

8. A connector according to claim 6, further comprising engaging portions positioned at front and rear portions of said pair of arms to interconnect pair of arms of two or more adjacent connectors.

9. A connector according to claim 7, further comprising an upper plate attached to a top surface of the pair of arms to provide a closed volume between the two adjacent connectors.

10. A connector according to claim 6, further comprising a rectifying member with an opening to take in air, wherein the rectifying member is installed at ends of said pair of arms to support an end part opposite to the connected end part of the electronic module.

11. A connector according to claim 6, wherein said contacts comprise front contacts and rear contacts extending downward from front and rear portions of said main body across said ventilation opening, and said front contacts and said rear contacts each have a streamline section toward an air flowing direction.

12. A connector according to claim 6, wherein said contacts comprise front contacts and rear contacts and rear contacts extending downward from front and rear portions of said main body across said ventilation opening and are provided with closure members to close space between said front contacts and said rear contacts.

13. A connector according to claim 6, wherein said contacts comprise front contacts and rear contacts extending downward from front and rear portions of said main body across said ventilation opening and dustproof members are provided for said front and rear contacts.

14. A connector according to claim 13, wherein said dustproof members are partition members to permit separation between adjacent contacts with respect to each of said front contacts and rear contacts.

15. A connector for connecting a mother board and a plate-like electronic module with electrical conductive pads at an end part, comprising a housing, ventilation openings and wall members, wherein the housing is mounted on mother board and provided with a main body and a pair of arms, the wall members are provided under said pair of arms, the main body has contacts of which one end is adapted for electrical connection to the mother board and an opposite end is adapted for electrical connection with the electrical conductive pad of the electronic module, the pair of arms extend from ends of the main body to secure the electronic module above the mother board a predetermined distance when the electrical conductive pads of the electronic module are connected to the contacts, the ventilation openings in the form of channels are disposed under the pair of arms and provide air to flow between the mother board and the electronic module.

16. A connector according to claim 15, wherein at least one of the ventilation openings has a configuration to extend in opening toward outside.

17. A connector according to claim 15, further comprising a wall member to interconnect ends of said pair of arms.

18. A connector according to claim 8, further comprising an upperplate attached to a surface of the pair of arms to provide a closed volume between the two adjacent connectors.

19. A connector according to claim 6, wherein said contacts comprise front contacts and rear contacts extending downward from front and rear portions of said main body across said ventilation opening, and said front contacts and said rear contacts each have a streamline section toward an air flowing direction.

20. A connector for connecting a mother board and a plate-like electronic module which has electrical conductive pads at one end of the connector, comprising:

a housing with ventilation openings, the housing including a main body and a pair of arms, wherein the main body has contacts of which one end is adapted for electrical connection to the mother board and an opposite end is adapted for electrical connection with the electrical conductive pads of the electronic module, and the pair of arms extend from the main body to secure the electronic module above the mother board by a predetermined distance when the electrical conductive pads of the electronic module are connected to the contacts, the ventilation openings in form of channels positioned under the pair of arms and provides air to flow between the mother board and the electronic module.

21. A connector according to claim 20, further comprising a rectifying member with an opening to take in air, wherein the rectifying member is installed at ends of said pair of arms to support an end part opposite to the connected end part of the electronic module.

\* \* \* \* \*